(12) United States Patent
Iizuka et al.

(10) Patent No.: US 10,910,241 B2
(45) Date of Patent: *Feb. 2, 2021

(54) WAFER PRODUCING APPARATUS AND CARRYING TRAY

(71) Applicant: DISCO CORPORATION, Tokyo (JP)

(72) Inventors: Kentaro Iizuka, Tokyo (JP); Naoki Omiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 16/209,285

(22) Filed: Dec. 4, 2018

(65) Prior Publication Data

US 2019/0181024 A1 Jun. 13, 2019

(30) Foreign Application Priority Data

Dec. 12, 2017 (JP) ................. 2017-237948

(51) Int. Cl.
*B23K 26/53* (2014.01)
*B23K 26/38* (2014.01)
(Continued)

(52) U.S. Cl.
CPC .... *H01L 21/67207* (2013.01); *B23K 26/0093* (2013.01); *B23K 26/0838* (2013.01); *B23K 26/38* (2013.01); *B23K 26/53* (2015.10); *B24B 7/228* (2013.01); *B24B 27/0069* (2013.01); *B28D 5/00* (2013.01); *H01L 21/304* (2013.01);
(Continued)

(58) Field of Classification Search
CPC .... B23K 26/53; B23K 2103/56; B23K 26/38; B23K 26/0838; B23K 2101/40; B23K 26/0093; H01L 21/673–67396; H01L 21/6732; H01L 21/67–67796

USPC ................. 206/712; 438/463, 464; 269/903, 269/289 R–289 MR, 9–10, 37–45, 287; 211/41.18

See application file for complete search history.

(56) References Cited

U.S. PATENT DOCUMENTS 3,169,295 A * 2/1965 Paspy ................... F27D 5/0012
432/259
3,469,686 A * 9/1969 Gutsche ............ H01L 21/67346
206/712
(Continued)

FOREIGN PATENT DOCUMENTS

JP 2000094221 A 4/2000
JP 2013049161 A 3/2013
(Continued)

*Primary Examiner* — Erica E Cadugan
(74) *Attorney, Agent, or Firm* — Greer Burns & Crain, Ltd.

(57) ABSTRACT

A wafer producing apparatus includes: an ingot grinding unit configured to grind and planarize an upper surface of an ingot held by a first holding table; a laser applying unit configured to apply a laser beam of such a wavelength as to be transmitted through the ingot to the ingot, with a focal point of the laser beam positioned at a depth corresponding to the thickness of a wafer to be produced from an upper surface of the ingot held by a second holding table, to form a peel-off layer; a wafer peeling unit configured to hold the upper surface of the ingot held by a third holding table and peel off the wafer from the peel-off layer; and a carrying tray having an ingot support section configured to support the ingot and a wafer support section configured to support the wafer.

7 Claims, 15 Drawing Sheets

(51) Int. Cl.

| | | |
|---|---|---|
| *B23K 26/08* | (2014.01) | |
| *H01L 21/673* | (2006.01) | |
| *H01L 21/677* | (2006.01) | |
| *H01L 21/304* | (2006.01) | |
| *B28D 5/00* | (2006.01) | |
| *B24B 7/22* | (2006.01) | |
| *H01L 21/67* | (2006.01) | |
| *B23K 26/00* | (2014.01) | |
| *B24B 27/00* | (2006.01) | |
| *B23K 103/00* | (2006.01) | |

(52) U.S. Cl.
CPC .... *H01L 21/6773* (2013.01); *H01L 21/67092* (2013.01); *H01L 21/67173* (2013.01); *H01L 21/67219* (2013.01); *H01L 21/67346* (2013.01); *H01L 21/67706* (2013.01); *H01L 21/67766* (2013.01); *H01L 21/67769* (2013.01); *B23K 2103/56* (2018.08); *Y10T 29/5139* (2015.01); *Y10T 29/5143* (2015.01); *Y10T 29/5196* (2015.01)

(56) References Cited

U.S. PATENT DOCUMENTS

| | | | | |
|---|---|---|---|---|
| 4,407,262 A * | 10/1983 | Wirz | ............... | B23D 59/008 |
| | | | | 125/13.01 |
| 4,993,895 A * | 2/1991 | Nordstrom | ............ | B23B 49/00 |
| | | | | 269/287 |
| 5,577,621 A * | 11/1996 | Yi | ............... | H01L 21/6732 |
| | | | | 211/41.18 |
| 6,145,673 A * | 11/2000 | Burrows | ............. | H01L 21/6732 |
| | | | | 211/41.12 |
| 6,261,370 B1 * | 7/2001 | Otsuki | ............ | H01L 21/67333 |
| | | | | 118/500 |
| 6,361,313 B1 * | 3/2002 | Beyaert | ............... | G03F 7/70691 |
| | | | | 211/41.18 |
| 8,067,820 B2 * | 11/2011 | Kihara | ............... | C30B 29/06 |
| | | | | 118/500 |
| 9,981,339 B2 * | 5/2018 | Hirata | ............... | B24B 7/228 |
| 10,573,505 B2 * | 2/2020 | Hirata | ............... | H01L 21/02013 |
| 2014/0374390 A1 * | 12/2014 | Beransky | ............ | B23K 37/0235 |
| | | | | 219/121.7 |
| 2015/0038062 A1 * | 2/2015 | Umeda | ............... | B23K 26/53 |
| | | | | 451/70 |
| 2016/0074960 A1 * | 3/2016 | Hirata | ............... | H01L 21/02008 |
| | | | | 225/2 |
| 2016/0152508 A1 * | 6/2016 | Kumkar | ............... | B23K 26/40 |
| | | | | 428/43 |
| 2016/0158882 A1 * | 6/2016 | Hirata | ............... | H01L 21/78 |
| | | | | 125/23.01 |
| 2017/0053829 A1 * | 2/2017 | Hirata | ............... | H01L 23/544 |
| 2017/0087671 A1 * | 3/2017 | Tanaka | ............... | B23K 26/064 |
| 2017/0301549 A1 * | 10/2017 | Suzuki | ............... | B24B 27/06 |
| 2019/0221436 A1 * | 7/2019 | Hirata | ............... | B24B 27/0076 |
| 2020/0130106 A1 * | 4/2020 | Iizuka | ............... | B23K 26/53 |

FOREIGN PATENT DOCUMENTS

| | | | |
|---|---|---|---|
| JP | 2013-179237 A | * | 9/2013 |
| JP | 2013-229508 A | * | 11/2013 |
| KR | 10-2129709 B1 | * | 7/2020 |

* cited by examiner

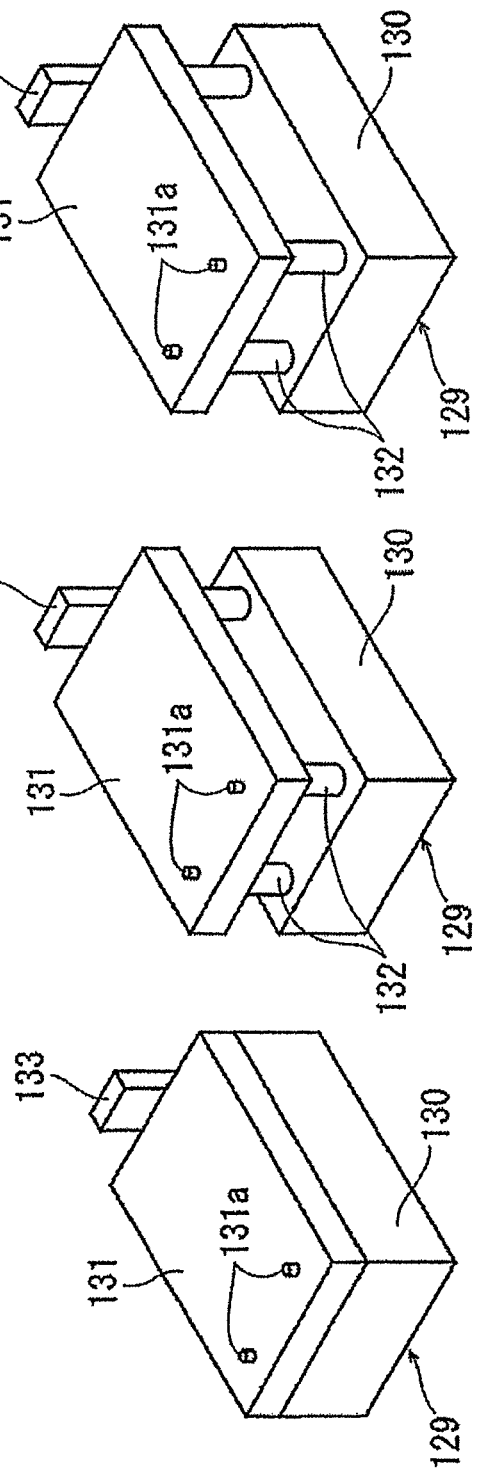

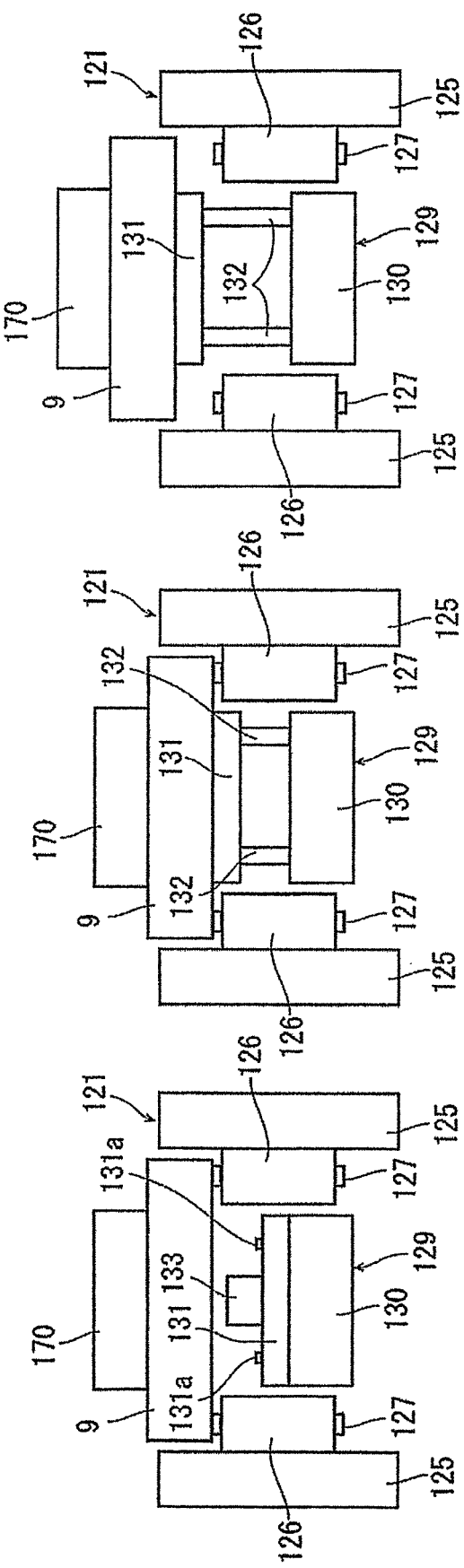

_(1)_

WAFER PRODUCING APPARATUS AND CARRYING TRAY

BACKGROUND OF THE INVENTION

Field of the Invention

The present invention relates to a wafer producing apparatus for producing a wafer from a hexagonal single crystal ingot, and a carrying tray for carrying the hexagonal single crystal ingot and the wafer.

Description of the Related Art

Devices such as integrated circuits (ICs), large scale integrations (LSIs) and light emitting diodes (LEDs) are formed by forming a functional layer on a front side of a wafer formed from silicon (Si), sapphire ($Al_2O_3$) or the like and portioning the functional layer by a plurality of intersecting division lines (streets). In addition, devices such as power devices and LEDs are formed by forming a functional layer on a front side of a wafer formed from hexagonal single crystal silicon carbide (SiC) and partitioning the functional layer by a plurality of intersecting division lines. The wafer formed with the devices is divided into individual device chips by processing along the division lines by a cutting apparatus or a laser processing apparatus, and the thus divided device chips are used for electric apparatuses such as mobile phones and personal computers.

The wafer to be formed with the devices is generally produced by slicing a cylindrical semiconductor ingot by a wire saw. The front side and the back side of the wafer thus cut are mirror finished by polishing (see, for example, Japanese Patent Laid-open No. 2000-94221). When the semiconductor ingot is sliced by the wire saw and the front side and the back side of the sliced wafer are polished, however, most part (70% to 80%) of the semiconductor ingot is discarded, which is uneconomical. Particularly, a single crystal SiC ingot is high in hardness and is difficult to slice by a wire saw, so that a considerable time is taken for slicing and productivity is therefore poor. In addition, the hexagonal single crystal ingot is high in unit cost, and has a problem as to efficient wafer production.

In view of the foregoing, there has been proposed a technology in which a laser beam of such a wavelength as to be transmitted through hexagonal single crystal SiC is applied to a hexagonal single crystal SiC ingot, with a focal point of the laser beam positioned inside the hexagonal single crystal SiC ingot, to form a peel-off layer at a scheduled cutting plane, and a wafer is peeled off from the hexagonal single crystal SiC ingot along the scheduled cutting plane where the peel-off layer is formed (see, for example, Japanese Patent Laid-open No. 2013-49161).

SUMMARY OF THE INVENTION

However, the step of forming the hexagonal single crystal ingot with the peel-off layer, the step of peeling off the wafer from the hexagonal single crystal ingot, and the step of grinding and planarizing the upper surface of the hexagonal single crystal ingot are performed through manual operations, which is poor in production efficiency.

It is therefore an object of the present invention to provide a wafer producing apparatus by which a wafer can be automatically produced from a hexagonal single crystal ingot.

It is another object of the present invention to provide a carrying tray by which the hexagonal single crystal ingot and the wafers peeled off from the hexagonal single crystal ingot can be carried, in a wafer producing apparatus capable of automatically producing wafers from a hexagonal single crystal ingot.

In accordance with an aspect of the present invention, there is provided a wafer producing apparatus for producing a wafer from a hexagonal single crystal ingot, the wafer producing apparatus including: an ingot grinding unit configured to include a first holding table adapted to hold the hexagonal single crystal ingot, and grinding means grinding and planarizing an upper surface of the ingot held by the first holding table; a laser applying unit configured to include a second holding table adapted to hold the hexagonal single crystal ingot, and laser applying means applying a laser beam of such a wavelength as to be transmitted through the hexagonal single crystal ingot to the hexagonal single crystal ingot, with a focal point of the laser beam positioned at a depth corresponding to the thickness of the wafer to be produced from the upper surface of the hexagonal single crystal ingot held by the second holding table, to form a peel-off layer; a wafer peeling unit configured to include a third holding table adapted to hold the hexagonal single crystal ingot, and wafer peeling means holding the upper surface of the hexagonal single crystal ingot held by the third holding table and peeling off the wafer from the peel-off layer; a carrying tray including an ingot support section configured to support the hexagonal single crystal ingot, and a wafer support section configured to support the peeled wafer; a belt conveyor unit configured to carry the hexagonal single crystal ingot held by the carrying tray between the ingot grinding unit and the laser applying unit and the wafer peeling unit; a cassette stocker in which a plurality of cassettes adapted to accommodate the peeled wafers are accommodated; and accommodating means accommodating the wafer supported by the wafer support section of the carrying tray into the cassette accommodated in the cassette stocker.

Preferably, the wafer producing apparatus includes an ingot stocker adapted to accommodate the hexagonal single crystal ingots. It is preferable that the accommodating means carries the hexagonal single crystal ingot accommodated in the ingot stocker to the belt conveyor unit. Preferably, the hexagonal single crystal ingot is accommodated in the ingot stocker in a state of being supported by the support tray.

In accordance with another aspect of the present invention, there is provided a carrying tray including: an ingot support section configured to support a hexagonal single crystal ingot; and a wafer support section configured to support a wafer.

Preferably, the carrying tray includes a casing having an upper wall, a lower wall, a pair of side walls connecting the upper wall and the lower wall, and a cavity penetrating between the pair of side walls, and one of the upper wall and the lower wall of the casing is provided with the ingot support section, and other of the lower wall or the upper wall is provided with the wafer support section. Preferably, the ingot support section has concentric recesses corresponding to ingots of two or more sizes, and the wafer support section has concentric recesses corresponding to wafers of two or more sizes.

According to the wafer producing apparatus of the present invention, a series of operations for producing a wafer from a hexagonal single crystal ingot can be carried out automatically, and production efficiency is enhanced.

According to the carrying tray of the present invention, the hexagonal single crystal ingot and the wafers peeled off from the hexagonal single crystal ingot can be carried, in a wafer producing apparatus capable of producing wafers automatically from a hexagonal single crystal ingot.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 10A is a perspective view of a carrying tray stopper in a state in which a lift plate is positioned at a passing position;

FIG. 10B is a perspective view of the carrying tray stopper in a state in which the lift plate is positioned at a stopping position;

FIG. 10C is a perspective view of the carrying tray stopper in a state in which the lift plate is positioned at a spacing position;

FIG. 11A is a sectional view of the carrying tray stopper and the like corresponding to the state depicted in FIG. 10A;

FIG. 11B is a sectional view of the carrying tray stopper and the like corresponding to the state depicted in FIG. 10B;

FIG. 11C is a sectional view of the carrying tray stopper and the like corresponding to the state depicted in FIG. 10C;

DETAILED DESCRIPTION OF THE PREFERRED EMBODIMENT

Figure 1:
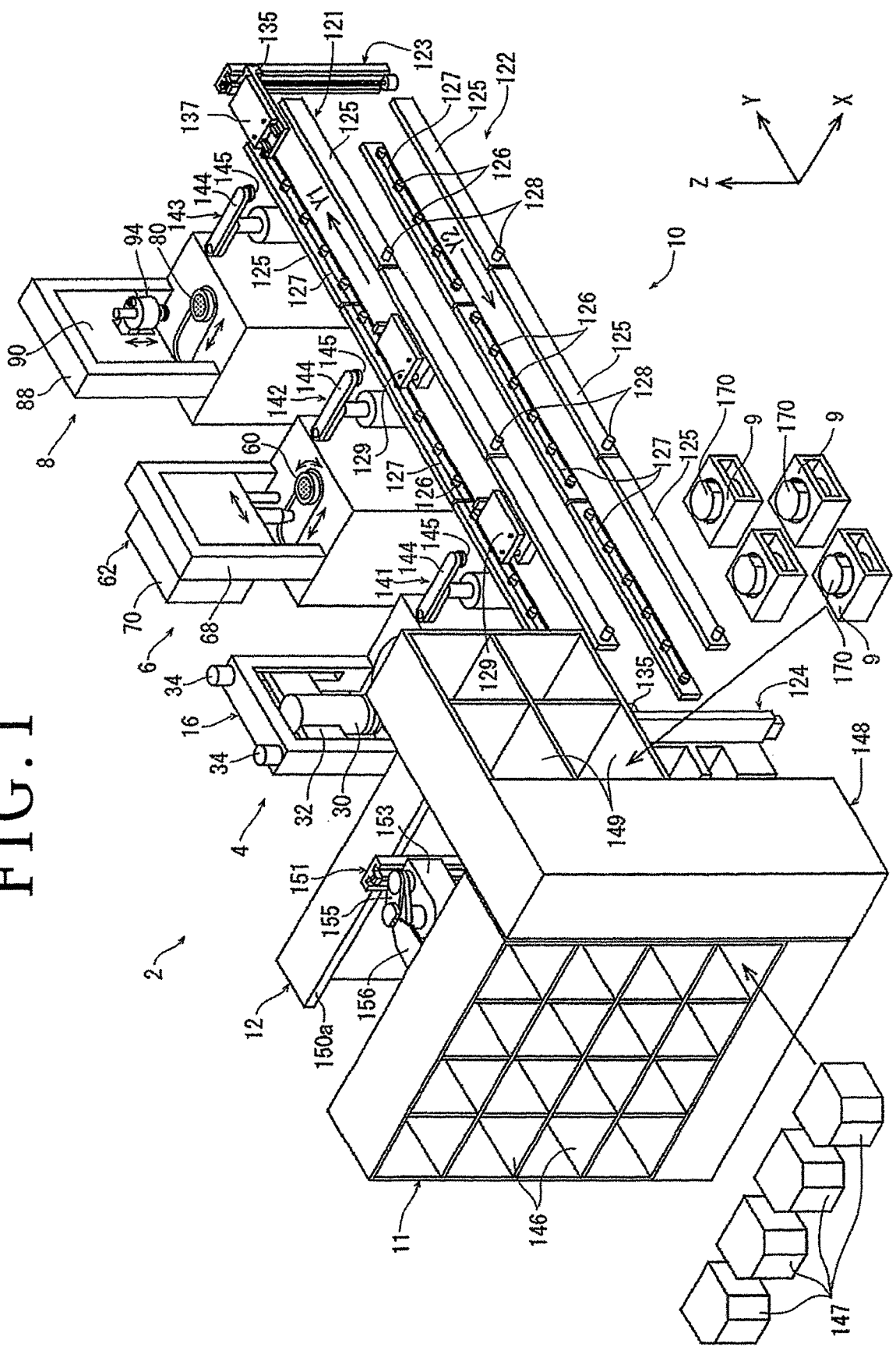
FIG. 1 is a perspective view of a wafer producing apparatus according to an embodiment of the present invention.

A wafer producing apparatus and a carrying tray according to an embodiment of the present invention will be described below, referring to the drawings. A wafer producing apparatus 2 depicted in FIG. 1 includes, at least: an ingot grinding unit 4; a laser applying unit 6; a wafer peeling unit 8; a carrying tray 9 having an ingot support section adapted to support an ingot and a wafer support section adapted to support a wafer; a belt conveyor unit 10 adapted to carry the ingot supported by the carrying tray 9 between the ingot grinding unit 4 and the laser applying unit 6 and the wafer peeling unit 8; a cassette stocker 11 in which a plurality of cassettes adapted to accommodate the peeled wafers are accommodated; and accommodating means 12 for accommodating the wafer supported by the wafer support section of the carrying tray 9 into the cassette accommodated in the cassette stocker 11.

Figure 2:
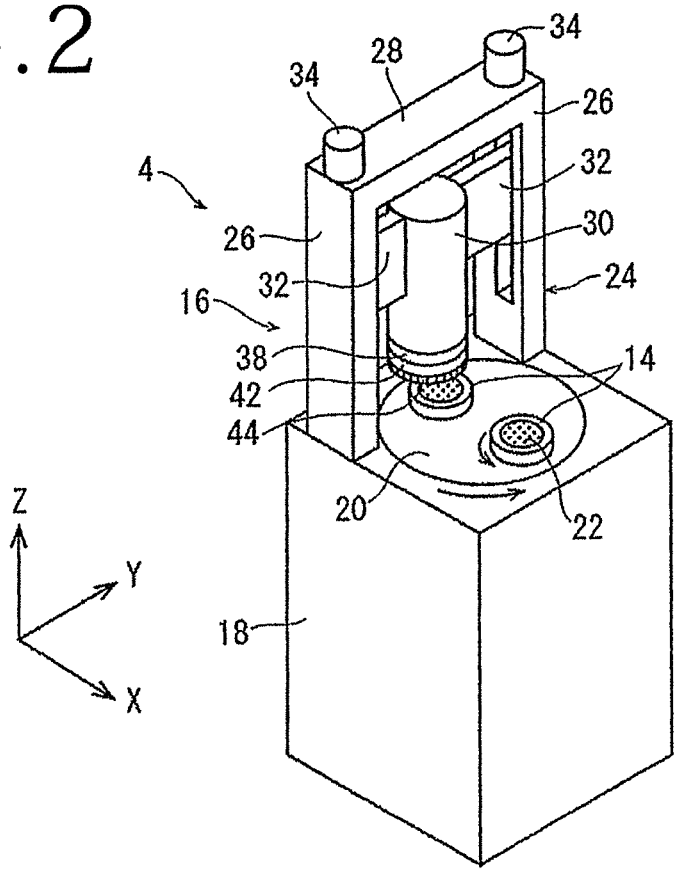
FIG. 2 is a perspective view of an ingot grinding unit depicted in FIG. 1.

Referring to FIG. 2, the ingot grinding unit 4 will be described. The ingot grinding unit 4 includes circular first holding tables 14 adapted to hold a hexagonal single crystal ingot (hereinafter referred to simply as ingot), and grinding means 16 for grinding and planarizing an upper surface of the ingot held by the first holding table 14. In the present embodiment, the ingot grinding unit 4 includes a rectangular parallelepiped shaped base 18, and a circular turntable 20 mounted on an upper surface of the base 18 in a rotatable manner. The turntable 20 is rotated around a rotational axis extending in a Z-axis direction while passing through a radial center of the turntable 20, by a turntable motor (not depicted) incorporated in the base 18. The first holding tables 14 in the present embodiment are rotatably mounted in a pair on the upper surface of the turntable 20, and are disposed in point symmetry with respect to the radial center (rotational center) of the turntable 20. By the rotation of the turntable 20, the first holding tables 14 are each alternately positioned at a grinding position (a position on the depth side in FIG. 2) where grinding is conducted by the grinding means 16 and at an ingot attachment/detachment position (a position on the viewer's side in FIG. 2) where the ingot is attached or detached. In addition, the first holding table 14 is rotated around a rotational axis extending in the Z-axis direction while passing a radial center of the first holding table 14, by a first holding table motor (not depicted) mounted to a lower surface of the turntable 20. A porous suction chuck 22 connected to suction means (not depicted) is disposed at an upper surface of the first holding table 14. The first holding table 14 can suction hold the ingot placed on the upper surface of the suction chuck 22, by generating a suction force at the upper surface of the suction chuck 22 by the suction means. Note that the Z-axis direction is the vertical direction indicated by arrow Z in FIG. 2 and the like. In addition, an X-axis direction indicated by arrow X in FIG. 2 and the like is a direction orthogonal to the Z-axis direction, and a Y-axis direction indicated by arrow Y in FIG. 2 and the like is a direction orthogonal to the X-axis direction and the Z-axis direction. A plane defined by the X-axis direction and the Y-axis direction is substantially horizontal.

Figure 3:
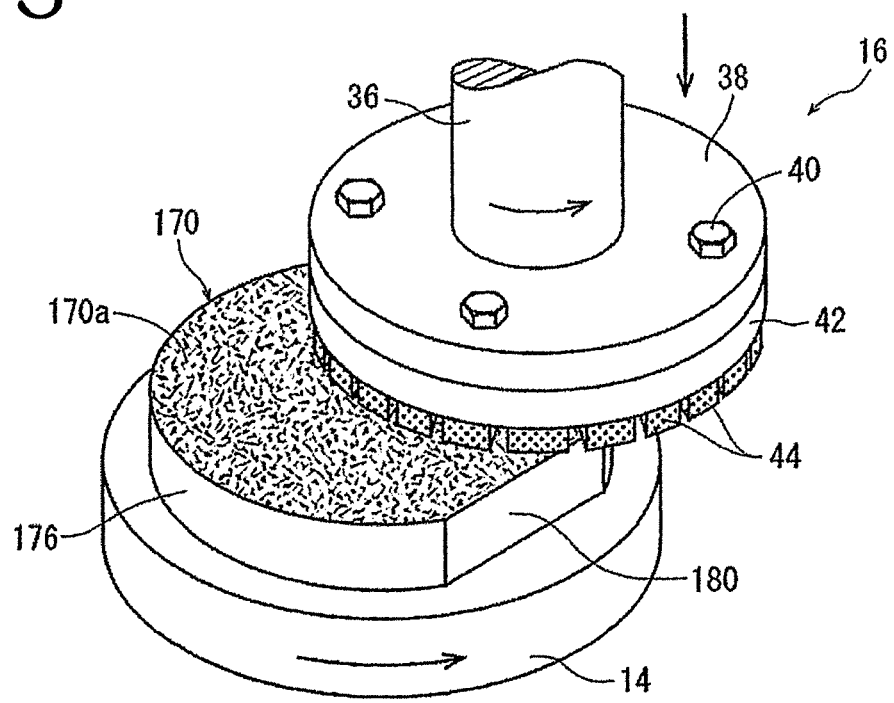
FIG. 3 is a partial enlarged perspective view of the ingot grinding unit depicted in FIG. 2.

Referring to FIG. 3 together with FIG. 2, the description of the ingot grinding unit 4 will be continued. In the present embodiment, as depicted in FIG. 2, the grinding means 16 of the ingot grinding unit 4 has a gate-formed support frame 24 mounted on the upper surface of the base 18. The support frame 24 includes a pair of support columns 26 extending upward from the upper surface of the base 18 with a spacing therebetween in the Y-axis direction, and a beam 28 extending in the Y-axis direction between upper ends of the support columns 26. A cylindrical spindle housing 30 is supported on the pair of support columns 26 through a pair of connection pieces 32 in such a manner as to be movable (liftable) in the Z-axis direction. A pair of lifting motors 34 for moving (lifting up and down) the spindle housing 30 in the Z-axis direction are mounted on an upper surface of the beam 28. The lifting motor 34 is connected to one end portion of a ball screw (not depicted) extending in the Z-axis direction inside the support column 26, and a nut section (not depicted) of the ball screw is fixed to the connection piece 32. A rotational motion of the lifting motor 34 is converted into a rectilinear motion, and the rectilinear motion is transmitted to the connection piece 32, by the ball screw, whereby the spindle housing 30 is lifted up or down. A cylindrical spindle 36 (see FIG. 3) is supported on the spindle housing 30 such as to be rotatable around an axis extending in the Z-axis direction. The spindle 36 is rotated around the axis extending in the Z-axis direction, by a spindle motor (not depicted) incorporated in the spindle housing 30. As depicted in FIG. 3, a circular disk-shaped wheel mount 38 is fixed to a lower end of the spindle 36, and an annular grinding wheel 42 is fixed to a lower surface of the wheel mount 38 by bolts 40. A plurality of grindstones 44, arranged in an annular pattern at intervals in a circumferential direction, are fixed to an outer peripheral edge portion of a lower surface of the grinding wheel 42. As depicted in FIG. 3, a rotational center of the grinding wheel 42 is displaced in relation to the rotational center of the first holding table 14 such that the grindstones 44 pass through the rotational center of the first holding table 14 when the first holding table 14 is positioned at the grinding position. For this reason, in the grinding means 16, when an upper surface of the ingot held by the first holding table 14 and the grindstones 44 are brought into contact with each other while the first holding table 14 and the grinding wheel 42 are rotated relative to each other, the whole part of the upper surface of the ingot can thereby be ground and planarized by the grindstones 44.

Figure 4:
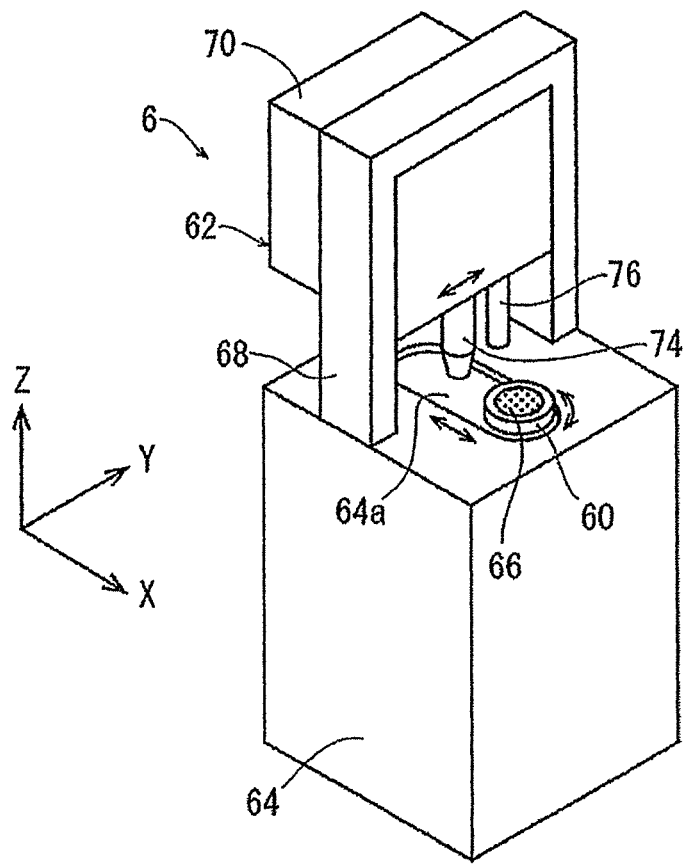
FIG. 4 is a perspective view of a laser applying unit depicted in FIG. 1.

The laser applying unit 6 will be described referring to FIGS. 1 and 4. As depicted in FIG. 1, the laser applying unit 6 disposed adjacently to the ingot grinding unit 4 includes, at least: a circular second holding table 60 adapted to hold the ingot; and laser applying means 62 by which a laser beam of such a wavelength as to be transmitted through the ingot is applied to the ingot, with a focal point of the laser beam positioned at a depth corresponding to the thickness of a wafer to be produced from the upper surface of the ingot held by the second holding table 60, to form a peel-off layer. In the present embodiment, as depicted in FIG. 4, the laser applying unit 6 has a rectangular parallelepiped shaped base 64. The base 64 is formed with a mounting recess 64a recessed downward from an upper surface of the base 64 and extending in the X-axis direction. The second holding table 60 in the present embodiment is mounted in the mounting recess 64a of the base 64 in such a manner as to be movable in the X-axis direction and be rotatable around an axis extending in the Z-axis direction. In addition, X-axis direction moving means (not depicted) for moving the second holding table 60 in the X-axis direction along the mounting recess 64a and a second holding table motor (not depicted) adapted to rotate the second holding table 60 in a rotational axis extending in the Z-axis direction while passing through a radial center of the second holding table 60 are mounted to the base 64. The X-axis direction moving means may include, for example, a ball screw (not depicted) of which a nut section is fixed to the second holding table 60 and which extends in the X-axis direction, and a motor (not depicted) connected to one end portion of the ball screw. The second holding table motor is moved in the X-axis direction by X-axis direction moving means together with the second holding table 60, and, therefore, even in the case where the second holding table 60 is moved in the X-axis direction by the X-axis direction moving means, the second holding table motor rotates the second holding table 60. In addition, a porous suction chuck 66 connected to suction means (not depicted) is disposed at an upper surface of the second holding table 60. With a suction force generated at an upper surface of the suction chuck 66 by the suction means, the second holding table 60 can suction hold the ingot placed on the upper surface of the suction chuck 66.

The description of the laser applying unit 6 will be continued referring to FIG. 4. The laser applying means 62 of the laser applying unit 6 in the present embodiment includes a gate-formed support frame 68 mounted on the upper surface of the base 64, a rectangular parallelepiped shaped casing 70 supported on the inside of the support frame 68, a Y-axis direction movable member (not depicted) mounted to a lower end side of the casing 70 such as to be movable in the Y-axis direction, and Y-axis direction moving means (not depicted) for moving the Y-axis direction movable member in the Y-axis direction. The Y-axis direction moving means may include, for example, a ball screw (not depicted) of which a nut section is fixed to the Y-axis direction movable member and which extends in the Y-axis direction, and a motor (not depicted) connected to one end portion of the ball screw.

Figure 5:
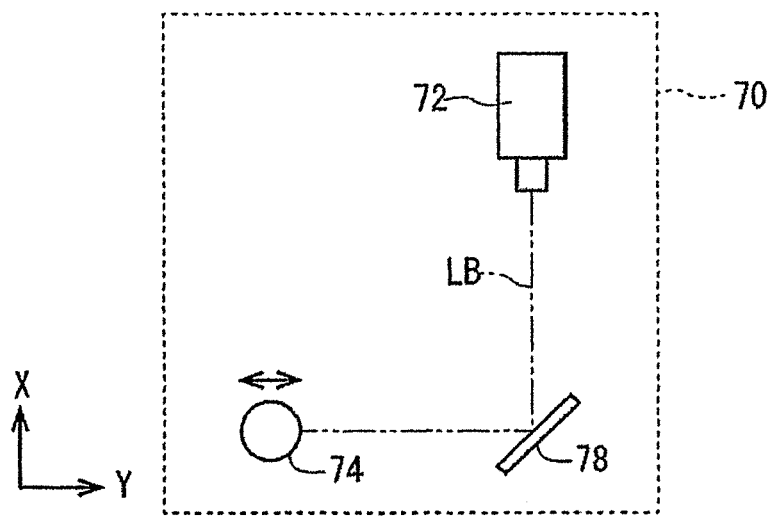
FIG. 5 is a block diagram of laser applying means depicted in FIG. 4.

Referring to FIG. 5 together with FIG. 4, the description of the laser applying means 62 will be continued. The laser applying means 62 further includes: a laser oscillator 72 (see FIG. 5) incorporated in the casing 70; a focusing apparatus 74 (see FIGS. 4 and 5) liftably mounted to a lower end side of the Y-axis direction movable member; alignment means 76 (see FIG. 4) mounted to the lower end side of the Y-axis direction movable member with a spacing from the focusing apparatus 74 in the Y-axis direction; and focal point position control means (not depicted) for lifting the focusing apparatus 74 up or down to control the Z-axis directional position of the focal point of a pulsed laser beam LB focused by the focusing apparatus 74. The laser oscillator 72 oscillates a pulsed laser of such a wavelength as to be transmitted through the ingot, and emits the pulsed laser beam LB. The focusing apparatus 74 has a focusing lens (not depicted) adapted to focus the pulsed laser beam LB emitted by the laser oscillator 72. The alignment means 76 images the ingot held by the second holding table 60, to detect a region to be laser processed. The focal point position control means may include, for example, a ball screw (not depicted) of which a nut section is fixed to the focusing apparatus 74 and which extends in the Z-axis direction, and a motor (not depicted) connected to one end portion of the ball screw.

Referring to FIG. 5, the description of the laser applying means 62 will be continued further. A first mirror 78 which is disposed with a spacing from the laser oscillator 72 in the X-axis direction and which reflects the pulsed laser beam LB emitted by the laser oscillator 72 in an optical path along the X-axis direction, to change the optical path of the pulsed laser beam LB, and a second mirror (not depicted) which is disposed on the upper side of the focusing apparatus 74 with a spacing from the first mirror 78 in the Y-axis direction and which changes the optical path of the pulsed laser beam LB reflected by the first mirror 78 from the Y-axis direction into the Z-axis direction, to lead the pulsed laser beam LB to the focusing apparatus 74, are incorporated in the casing 70. The second mirror is mounted to the Y-axis direction movable member, such as to be moved in the Y-axis direction together with the focusing apparatus 74 and the alignment means 76 when the Y-axis direction movable member is moved by the Y-axis direction moving means. The pulsed laser beam LB emitted from the laser oscillator 72 with the optical path set in the X-axis direction has its optical path changed from the X-axis direction into the Y-axis direction by the first mirror 78, to be thereby led to the second mirror, then has its optical path changed from the Y-axis direction into the Z-axis direction by the second mirror, to be led to the focusing apparatus 74, where the pulsed laser beam LB is focused by the focusing lens of the focusing apparatus 74, and is applied to the ingot held by the second holding table 60. In addition, in the case where the focusing apparatus 74 is moved in the Y-axis direction by moving the Y-axis direction movable member by the Y-axis direction moving means, and also in the case where the focusing apparatus 74 is lifted up or down by the focal point position control means, the pulsed laser beam LB emitted from the laser oscillator 72 in parallel to the X-axis direction has its optical path changed from the X-axis direction into the Y-axis direction by the first mirror 78, to be led to the second mirror, and the pulsed laser beam LB led to the second mirror has its optical path changed from the Y-axis direction into the Z-axis direction by the second mirror, to be led to the focusing apparatus 74.

In the laser applying means 62 configured as above, the ingot held by the second holding table 60 is imaged by the alignment means 76, to detect the region to be laser processed, and the focusing apparatus 74 is lifted up or down by the focal point position control means, whereby the pulsed laser beam LB having such a wavelength as to be transmitted through the ingot is positioned at a depth corresponding to the thickness of the wafer to be produced from the upper surface of the ingot held by the second holding table 60. In this state, the pulsed laser beam LB is applied to the ingot held by the second holding table 60 while moving the focusing apparatus 74 as required in the Y-axis direction by the Y-axis direction moving means, whereby a peel-off layer where the intensity of the ingot is lowered can be formed inside the ingot. Note that at the time of applying the pulsed laser beam LB to the ingot held by the second holding table 60, the second holding table 60 may be moved in the X-axis direction by the X-axis direction moving means.

Figure 6:
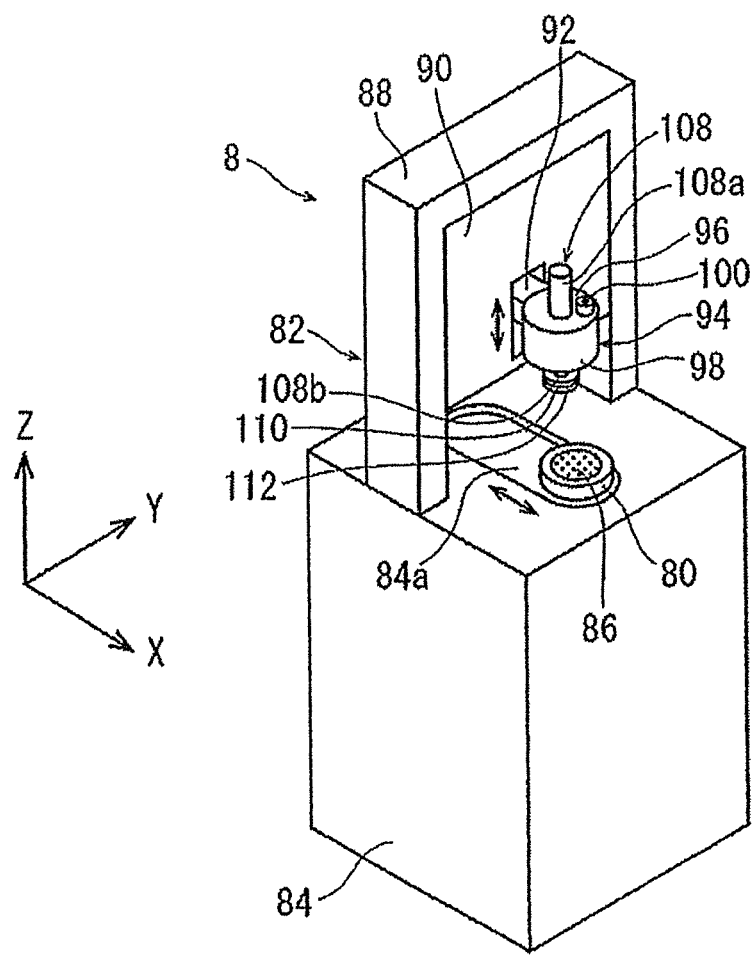
FIG. 6 is a perspective view of a wafer peeling unit depicted in FIG. 1.

Referring to FIGS. 1 and 6, the wafer peeling unit 8 will be described. As depicted in FIG. 1, the wafer peeling unit 8 disposed adjacently to the laser applying unit 6 includes, at least: a circular third holding table 80 adapted to hold the ingot; and wafer peeling means 82 for holding the upper surface of the ingot held by the third holding table 80 and peeling off the wafer from the peel-off layer. In the present embodiment, as depicted in FIG. 6, the wafer peeling unit 8 has a rectangular parallelepiped shaped base 84. The base 84 is formed with a mounting recess 84a recessed downward from an upper surface of the base 84 and extending in the X-axis direction. The third holding table 80 in the present embodiment is mounted in the mounting recess 84a of the base 84 in such a manner as to be movable in the X-axis direction. In addition, X-axis direction moving means (not depicted) for moving the third holding table 80 in the X-axis direction along the mounting recess 84a is mounted to the base 84. The X-axis direction moving means may include, for example, a ball screw (not depicted) of which a nut section is fixed to the third holding table 80 and which extends in the X-axis direction, and a motor (not depicted) connected to one end portion of the ball screw. In addition, a porous suction chuck 86 connected to suction means (not depicted) is disposed at an upper surface of the third holding table 80. With a suction force generated at an upper surface of the suction chuck 86 by the suction means, the third holding table 80 can suction hold the ingot mounted on the upper surface of the suction chuck 86.

The description of the wafer peeling unit 8 will be continued referring to FIG. 6. The wafer peeling means 82 of the wafer peeling unit 8 in the present embodiment includes: a gate-formed support frame 88 mounted on the upper surface of the base 84; a rectangular parallelepiped shaped casing 90 supported on the inside of the support frame 88; an arm 92 extending in the X-axis direction from a base end portion supported by the casing 90 in such a manner as to be movable upward and downward; and arm moving means (not depicted) for moving the arm 92 upward and downward. The arm moving means may include, for example, a ball screw (not depicted) of which a nut section is fixed to a base portion of the arm 92 and which extends in the Z-axis direction, and a motor (not depicted) connected to one end portion of the ball screw.

Figure 7:
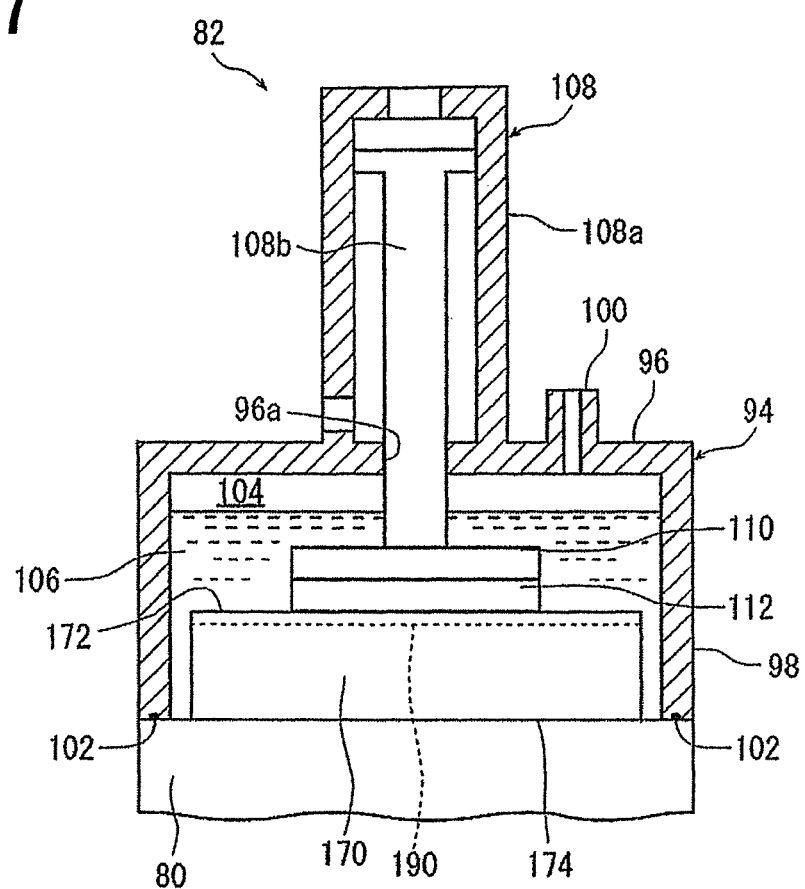
FIG. 7 is a partially sectional view of the wafer peeling unit depicted in FIG. 6.

Referring to FIG. 7 together with FIG. 6, the description of the wafer peeling means 82 will be continued. As depicted in FIG. 6, a liquid tank 94 adapted to accommodate a liquid in cooperation with the third holding table 80 at the time of peeling off the wafer from the ingot is fixed to a tip portion of the arm 92. The liquid tank 94 has a circular top surface wall 96, and a cylindrical skirt wall 98 drooping down from a peripheral edge of the top surface wall 96, with a lower end side of the liquid tank being open. The outside diameter of the skirt wall 98 is not greater than the diameter of the third holding table 80, and a lower end of the skirt wall 98 comes into contact with an upper surface of the third holding table 80 when the arm 92 is lowered. The top surface wall 96 is additionally provided with a cylindrical liquid supply section 100 providing communication between the outside and the inside of the liquid tank 94, and the liquid supply section 100 is connected to liquid supply means (not depicted) through a flow passage. As depicted in FIG. 7, an annular packing 102 is additionally provided at a lower end of the skirt wall 98. When the arm 92 is lowered by the arm moving means to put the lower end of the skirt wall 98 into close contact with the upper surface of the third holding table 80, a liquid accommodating space 104 is defined by the upper surface of the third holding table 80 and an inner surface of the liquid tank 94. A liquid 106 supplied from the liquid supply means into the liquid accommodating space 104 through the liquid supply section 100 is prevented from leaking out of the liquid accommodating space 104 by the packing 102.

The description of the wafer peeling means 82 will be continued referring to FIGS. 6 and 7. An air cylinder 108 is mounted to the top surface wall 96 of the liquid tank 94, and a cylinder tube 108a of the air cylinder 108 extends upward from an upper surface of the top surface wall 96. As depicted in FIG. 7, a lower end portion of a piston rod 108b of the air cylinder 108 passes through a penetrating opening 96a of the top surface wall 96, to protrude to the lower side of the top surface wall 96. A circular disk-shaped ultrasonic vibration generating member 110 which may be formed from a piezoelectric ceramic or the like is fixed to the lower end portion of the piston rod 108b. A circular disk-shaped suction piece 112 is fixed to a lower surface of the ultrasonic vibration generating member 110. The suction piece 112, which is formed with a plurality of suction holes (not depicted) in a lower surface thereof, is connected to suction means (not depicted) through a flow passage. With a suction force generated at the lower surface of the suction piece 112 by the suction means, the suction piece 112 can suction hold the ingot. In the wafer peeling means 82, the arm 92 is lowered by the arm moving means, to bring the lower end of the skirt wall 98 into close contact with the upper surface of the third holding table 80 holding thereon the ingot formed with a peel-off layer, and the piston rod 108b of the air cylinder 108 is lowered, to attach the suction piece 112 to the upper surface of the ingot by suction. In this state, the liquid 106 is accommodated in the liquid accommodating space 104, after which the ultrasonic vibration generating member 110 is operated to apply an ultrasonic vibration to the ingot, whereby the strength of the peel-off layer can be lowered further. In addition, in the wafer peeling means 82, by moving the suction piece 112 upward by the air cylinder 108 in a state in which the upper surface of the ingot is suction held by the suction piece 112, the wafer can be peeled off from the ingot, with the peel-off layer where strength has been lowered as a start point of peeling.

Figure 8:
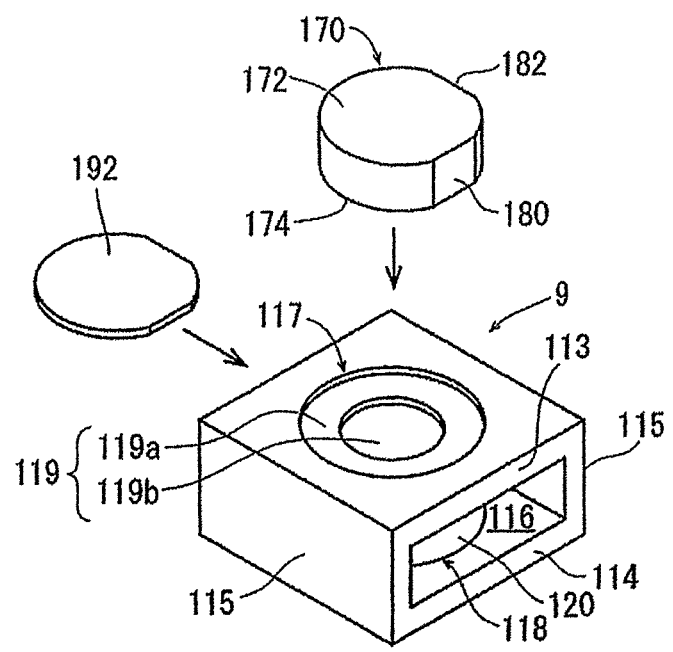
FIG. 8 is a perspective view of a carrying tray depicted in FIG. 1.

The carrying tray 9 will be described referring to FIG. 8. The carrying tray 9 in the present embodiment is composed of a casing which includes a rectangular upper wall 113, a rectangular lower wall 114 disposed on the lower side of the upper wall 113, a pair of rectangular side walls 115 connecting the upper wall 113 and the lower wall 114, and a cavity 116 penetrating between the pair of side walls 115. An ingot support section 117 adapted to support the ingot is provided at an upper surface of the upper wall 113, and a wafer support section 118 adapted to support the peeled wafer is provided at an upper surface of the lower wall 114. The ingot support section 117 in the present embodiment has concentric recesses 119 corresponding to ingots of two or more sizes. The recesses 119 have an annular large-diameter recess 119a recessed downward from the upper surface of the upper wall 113, and a circular small-diameter recess 119b smaller in diameter than the large-diameter recess 119a and recessed downward further than the large-diameter recess 119a. The large-diameter recess 119a and the small-diameter recess 119b are formed concentrically. The carrying tray 9 is configured to support an ingot of a comparatively large diameter (for example, 6 inches in diameter) by the large-diameter recess 119a, and to support an ingot of a comparatively small diameter (for example, 5 inches in diameter) by the small-diameter recess 119b. In addition, while detailed illustration is omitted, the wafer support section 118 has concentric recesses 120 corresponding to wafers of two or more sizes. The configuration of the recesses 120 of the wafer support section 118 may be similar to the configuration of the recesses 119 of the ingot support section 117, having an annular large-diameter recess recessed downward from the upper surface of the lower wall 114, and a circular small-diameter recess smaller in diameter than the large-diameter recess and recessed downward further than the large-diameter recess. The large-diameter recess and the small-diameter recess of the wafer support section 118 may be formed concentrically. The carrying tray 9 is configured to support a wafer of a comparatively large diameter (for example, 6 inches in diameter) by the large-diameter recess of the wafer support section 118, and to support a wafer of a comparatively small diameter (for example, 5 inches in diameter) by the small-diameter recess of the wafer support section 118. Note that a configuration of the carrying tray 9 may be adopted in which, conversely to the present embodiment, the wafer support section is provided at the upper surface of the upper wall 113 and the ingot support section is provided at the upper surface of the lower wall 114.

Figure 9:
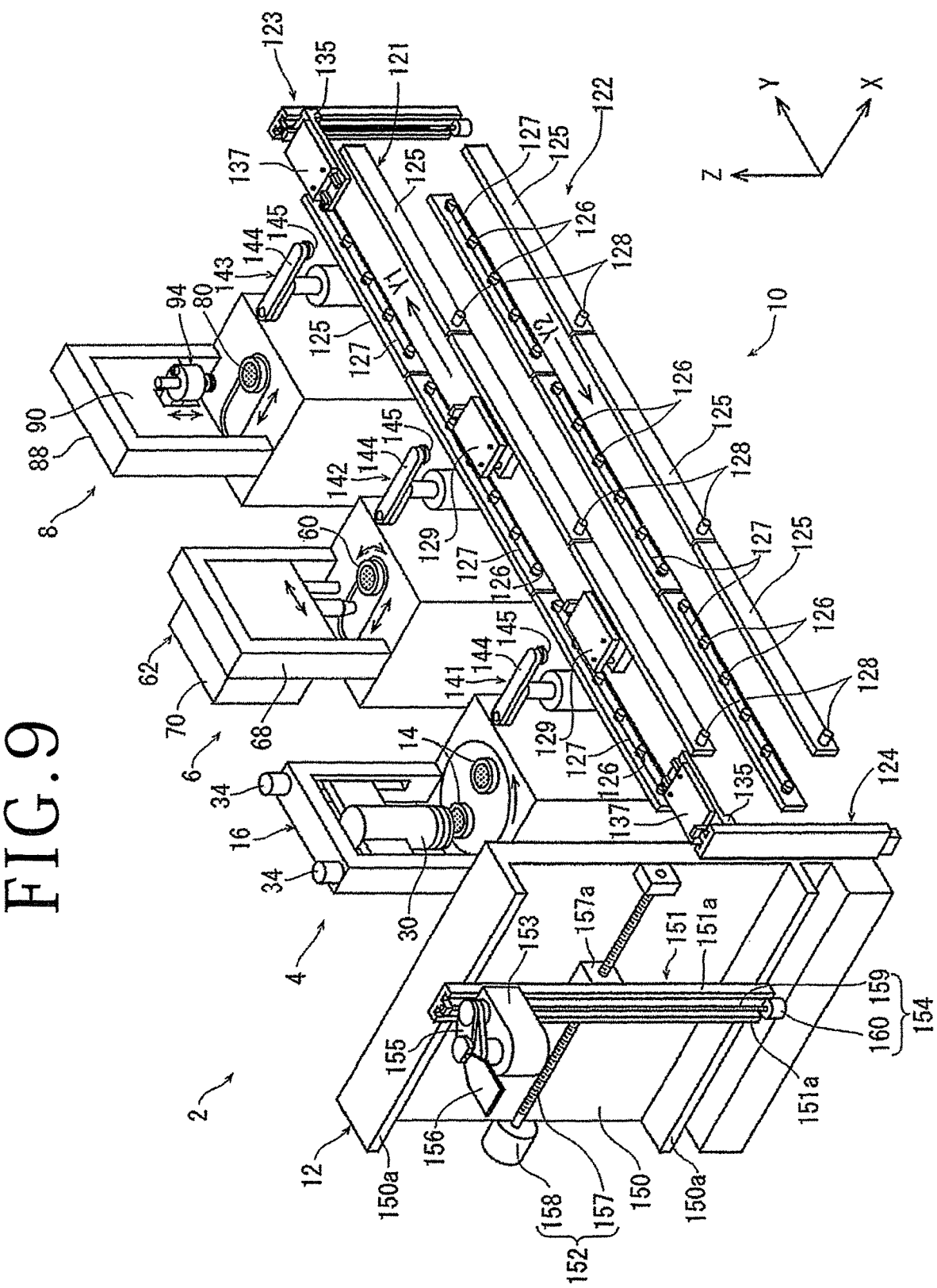
FIG. 9 is a partial perspective view of the wafer producing apparatus depicted in FIG. 1.

Referring to FIG. 9, the belt conveyor unit 10 will be described. The belt conveyor unit 10, which is disposed along the ingot grinding unit 4 and the laser applying unit 6 and the wafer peeling unit 8, includes, at least: forward-path belt conveyors 121 adapted to carry the carrying tray 9 in a Y1 direction indicated by arrow Y1 in FIG. 9; return-path belt conveyors 122 adapted to carry the carrying tray 9 in a Y2 direction (a direction opposite to the Y1 direction) indicated by arrow Y2 in FIG. 9; first carrying means 123 for carrying the carrying tray 9 from a finish point of the forward-path belt conveyors 121 to a start point of the return-path belt conveyors 122; and second carrying means 124 for carrying the carrying tray 9 from a finish point of the return-path belt conveyors 122 to a start point of the forward-path belt conveyors 121.

As depicted in FIG. 9, the forward-path belt conveyor 121 includes: a pair of support walls 125 extending in the Y-axis direction with a spacing therebetween in the X-axis direction; a plurality of rollers 126 rotatably mounted on inner surfaces of the support walls 125 at intervals in the Y-axis direction; a pair of endless belts 127 wrapped around the rollers 126; and a motor 128 adapted to rotate the rollers 126. While three forward-path belt conveyors 121 are disposed along the Y-axis direction in the present embodiment, the length of a carrying path for the carrying tray 9 can be changed by changing, as required, the number of the forward-path belt conveyors 121 and the Y-axis directional length of the support walls 125. In the forward-path belt conveyors 121, with the endless belts 127 rotated by the motor 128 through the rollers 126, the carrying tray 9 mounted on the endless belts 127 is carried in the Y1 direction. In the present embodiment, as depicted in FIG. 9, the configuration of the return-path belt conveyors 122 disposed under the forward-path belt conveyors 121 may be substantially the same as the configuration of the forward-path belt conveyors 121, and, therefore, the components of the return-path belt conveyors 122 are denoted by the same reference symbols for the components of the forward-path belt conveyors 121. In the return-path belt conveyors 122, the endless belts 127 are rotated by the motor 128 through the rollers 126 in the direction opposite to that in the forward-path belt conveyors 121, whereby the carrying tray 9 mounted on the endless belts 127 are carried in the Y2 direction. Note that the return-path belt conveyors 122 may not be disposed on the lower side of the forward-path belt conveyors 121, and the return-path belt conveyors 122 may be disposed on the upper side or a lateral side of the forward-path belt conveyors 121. In addition, while the wafer producing apparatus 2 is operated, the forward-path belt conveyors 121 and the return-path belt conveyors 122 are preferably operated constantly.

The description will be continued referring to FIGS. 10A to 10C and FIGS. 11A to 11C together with FIG. 9. Carrying tray stoppers 129 adapted to stop the carrying tray 9 being carried by the forward-path belt conveyors 121 are disposed at a position facing the ingot grinding unit 4 and a position facing the laser applying unit 6, of the forward-path belt conveyors 121. In the present embodiment, as depicted in FIGS. 10A to 10C, the carrying tray stopper 129 includes: a base 130 fixed by an appropriate bracket (not depicted); a liftable plate 131 supported on an upper surface of the base 130 such as to be liftable up and down; cylinder means 132 adapted to lift the liftable plate 131 up and down; and a stopper piece 133 fixed to a carrying direction downstream-side end portion (Y1 direction downstream-side end portion) of the forward belt conveyors 121. An upper surface of the liftable plate 131 is formed with a pair of engaging projections 131a for engagement with a pair of engaged recesses (not depicted) formed in a lower surface of the lower wall 114 of the carrying tray 9. As depicted in FIGS. 10A to 11C, the cylinder means 132, of an air-driven type or an electrically driven type, positions the liftable plate 131 at a passage position (for example, a position depicted in FIGS. 10A and 11A) where an upper end of the stopper piece 133 is located below a lower end of the carrying tray 9 being carried by the forward-path belt conveyors 121, a stop position (for example, a position depicted in FIGS. 10B and 11B) where the stopper piece 133 makes contact with the carrying tray 9 being carried by the forward-path belt conveyors 121, and a spacing position (for example, a position depicted in FIGS. 10C and 11C) where the carrying tray 9 is spaced from the endless belts 127.

In the carrying tray stopper 129, by positioning the liftable plate 131 at the passage position, the carrying tray 9 is permitted to pass above the upper side of the carrying tray stopper 129, and, by positioning the liftable plate 131 at the stop position above the passage position, the carrying tray 9 being carried by the forward-path belt conveyor 121 can be stopped. Further, in the carrying tray stopper 129, by positioning the liftable plate 131 at the spacing position above the stop position, a load exerted on the motor 128 of the forward-path belt conveyor 121 can be prevented from increasing due to frictional contact between a lower surface of the stopped carrying tray 9 and an upper surface of the endless belt 127. In addition, when the engaging projections 131a of the liftable plate 131 are engaged with the engaged recesses of the carrying tray 9 at the stop position or the spacing position, positional deviation of the carrying tray 9 on the liftable plate 131 is prevented.

Figure 12A:
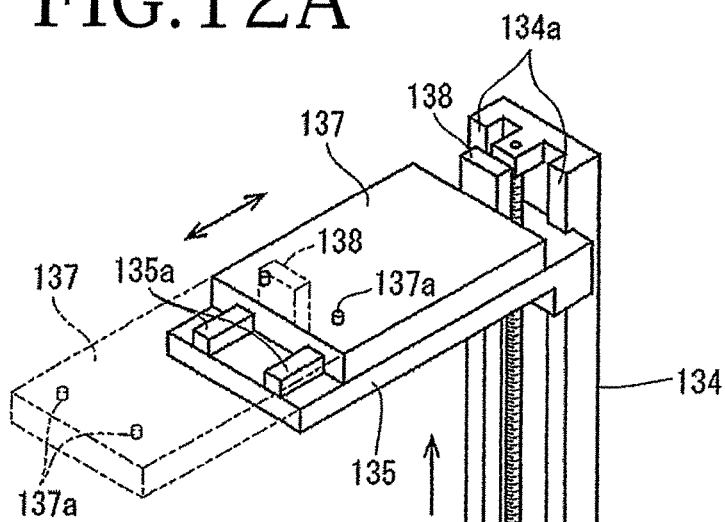
FIG. 12A is a perspective view of first carrying means in a state in which the lift plate is positioned at a lifting-up position.
Figure 12B:
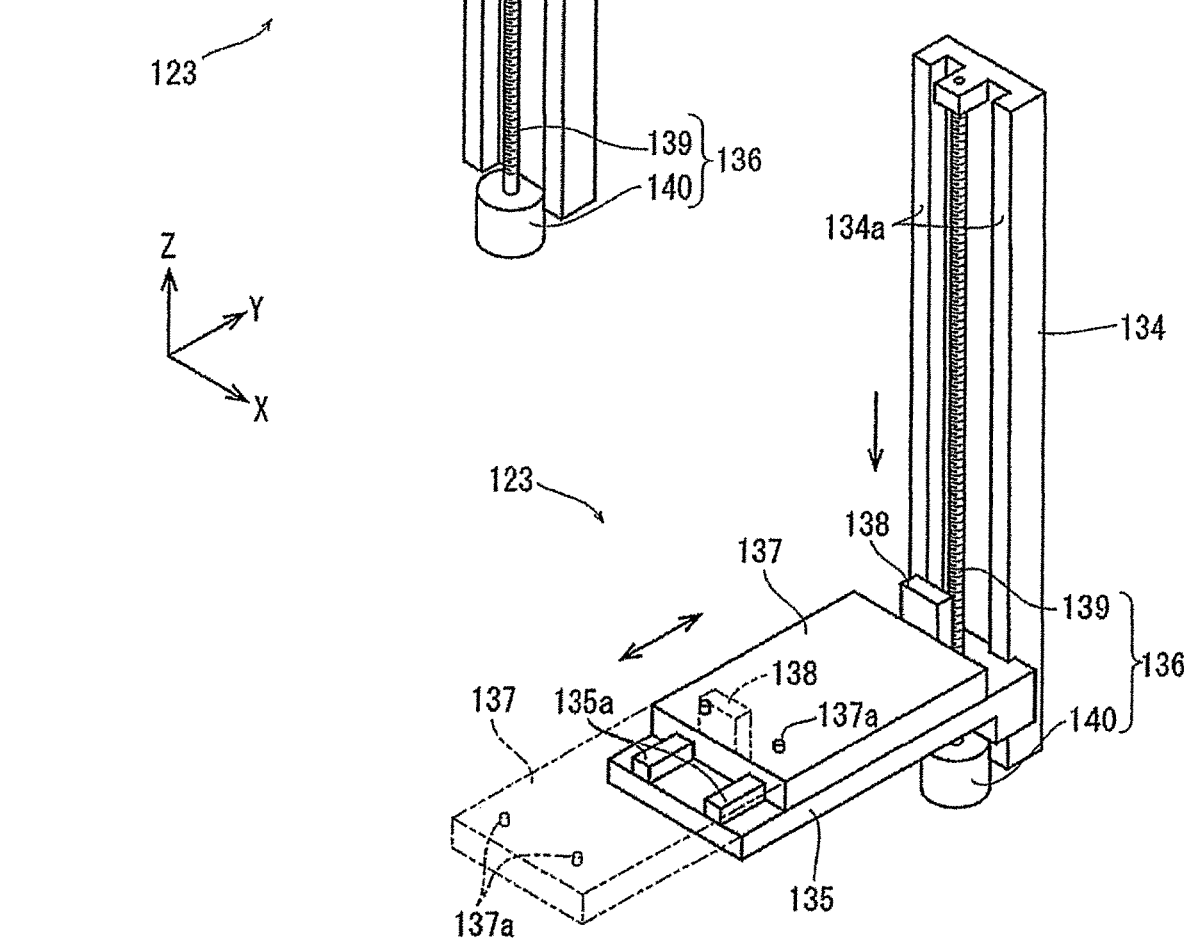
FIG. 12B is a perspective view of the first carrying means in a state in which the lift plate is positioned at a lifting-down position.

Referring to FIG. 9 and FIGS. 12A and 12B, the first carrying means 123 will be described. The first carrying means 123 disposed adjacently to the finish point of the forward-path belt conveyors 121 and the start point of the return-path belt conveyors 122 includes: a support wall 134 extending in the Z-axis direction; a liftable plate 135 liftably supported by the support wall 134; lift means 136 for lifting the liftable plate 135 up and down; a Y-axis direction movable plate 137 supported by an upper surface of the liftable plate 135 in such a manner as to be movable in the Y-axis direction; Y-axis direction moving means (not depicted) for moving the Y-axis direction movable plate 137 in the Y-axis direction; and a stopper piece 138 fixed to a Y1 direction downstream-side end portion of the Y-axis direction movable plate 137. The lift means 136 includes a ball screw 139 connected to the liftable plate 135 and extending in the Z-axis direction, and a motor 140 connected to a lower end of the ball screw 139, and lifts the liftable plate 135 up and down along guide rails 134a of the support wall 134, and stops at an arbitrary position, between a lift-up position depicted in FIG. 12A and a lift-down position depicted in FIG. 12B. An upper surface of the Y-axis direction movable plate 137 is formed with a pair of engaging projections 137a for engagement with the pair of engaged recesses of the carrying tray 9. The Y-axis direction moving means is composed of, for example, an air cylinder or an electrically driven cylinder, and moves the Y-axis direction movable plate 137 in the Y-axis direction along guide rails 135a of the liftable plate 135, between an advanced position indicated by alternate long and two short dashes lines in FIGS. 12A and 12B and a retreated position indicated by solid lines in FIGS. 12A and 12B.

In the first carrying means 123, by positioning an upper surface of the Y-axis direction movable plate 137 slightly below an upper surface of the endless belt 127 of the forward-path belt conveyor 121 and positioning the Y-axis direction movable plate 137 at the advanced position, the stopper piece 138 can be brought into contact with the carrying tray 9 being carried by the forward-path belt conveyors 121, to stop the carrying tray 9 at the finish point of the forward-path belt conveyors 121 (in the present embodiment, this point is also a position for facing the wafer peeling unit 8). In addition, by lifting up the liftable plate 135 in a state in which the carrying tray 9 is stopped, the lower surface of the carrying tray 9 can be spaced from the upper surface of the endless belt 127, and the carrying tray 9 can be mounted on the upper surface of the Y-axis direction movable plate 137. When the carrying tray 9 is mounted on the Y-axis direction movable plate 137, the engaging projections 137a of the Y-axis direction movable plate 137 are engaged with the engaged recesses of the carrying tray 9, whereby positional deviation of the carrying tray 9 on the Y-axis direction movable plate 137 is prevented.

In addition, when the Y-axis direction movable plate 137 with the carrying tray 9 mounted thereon is positioned at the retreated position, then the liftable plate 135 is lifted down until the upper surface of the Y-axis direction movable plate 137 is positioned slightly above the upper surface of the endless belt 127 of the return-path belt conveyor 122, subsequently the Y-axis direction movable plate 137 is positioned at the advanced position, and the liftable plate 135 is slightly lifted down, the carrying tray 9 can thereby be transferred from the Y-axis direction movable plate 137 onto the endless belt 127 of the return-path belt conveyor 122. In this way, the first carrying means 123 carries the carrying tray 9 from the finish point of the forward-path belt conveyors 121 to the start point of the return-path belt conveyors 122. Note that in the case where the return-path belt conveyors 122 are disposed on a lateral side of the forward-path belt conveyors 121, the first carrying means 123 is provided with X-axis direction moving means (which may be composed of, for example, a ball screw and a motor) for moving the liftable plate 135 in the X-axis direction, whereby the carrying tray 9 can be carried from the finish point of the forward-path belt conveyors 121 to the start point of the return-path belt conveyors 122.

In the present embodiment, as depicted in FIG. 9, the second carrying means 124 disposed adjacently to the start point of the forward-path belt conveyors 121 and the finish point of the return-path belt conveyors 122 may be substantially the same as the first carrying means 123 in configuration, and, therefore, components of the second carrying means 124 are denoted by the same reference symbols as those used for the components of the first carrying means 123. In the second carrying means 124, by positioning the upper surface of the Y-axis direction movable plate 137 slightly below the upper surface of the endless belt 127 of the return-path belt conveyor 122 and positioning the Y-axis direction movable plate 137 at the advanced position, the stopper piece 138 can be brought into contact with the carrying tray 9 being carried by the return-path belt conveyors 122, to stop the carrying tray 9 at the finish point of the return-path belt conveyors 122. In addition, by lifting up the liftable plate 135 in a state in which the carrying tray 9 is stopped, the lower surface of the carrying tray 9 can be spaced from the upper surface of the endless belt 127, and the carrying tray 9 can be mounted on the upper surface of the Y-axis direction movable plate 137. When the carrying tray 9 is mounted on the Y-axis direction movable plate 137, the engaging projections 137a of the Y-axis direction movable plate 137 are engaged with the engaged recesses of the carrying tray 9, whereby positional deviation of the carrying tray 9 on the Y-axis direction movable plate 137 is prevented.

In addition, when the Y-axis direction movable plate 137 with the carrying tray 9 mounted thereon is positioned at the retreated position, then the liftable plate 135 is lifted up until the upper surface of the Y-axis direction movable plate 137 is positioned slightly above the upper surface of the endless belt 127 of the forward-path belt conveyor 121, subsequently the Y-axis direction movable plate 137 is positioned at the advanced position, and the liftable plate 135 is slightly lifted down, the carrying tray 9 can thereby be transferred from the Y-axis direction movable plate 137 onto the endless belt 127 of the forward-path belt conveyor 121. In this way, the second carrying means 124 carries the carrying tray 9 from the finish point of the return-path belt conveyors 122 to the start point of the forward-path belt conveyors 121.

In the present embodiment, as depicted in FIG. 9, the belt conveyor unit 10 further includes: first transfer means 141 for transferring the ingot between the carrying tray 9 stopped by the carrying tray stopper 129 on the start point side of the forward-path belt conveyors 121 and the ingot grinding unit 4; second transfer means 142 for transferring the ingot between the carrying tray 9 stopped by the carrying tray stopper 129 on the finish point side of the forward-path belt conveyors 121 and the laser applying unit 6; and third transfer means 143 for transferring the ingot between the carrying tray 9 stopped by the first carrying means 123 and the wafer peeling unit 8 and transferring the wafer peeled off from the ingot from the wafer peeling unit 8 onto the carrying tray 9. The second transfer means 142 and the third transfer means 143 may be the same as the first transfer means 141 in configuration, and, therefore, the configuration of the first transfer means 141 will be described, and the descriptions of the configurations of the second transfer means 142 and the third transfer means 143 will be omitted.

The first transfer means 141 includes a first articulated arm 144, a drive source (not depicted) adapted to drive the articulated arm 144, and a suction piece 145 mounted to a tip of the articulated arm 144. The drive source composed of an air drive source or an electric drive source drives the articulated arm 144 to position the suction piece 145 at arbitrary positions in the X-axis direction, the Y-axis direction and the Z-axis direction, and inverts the suction piece 145 upside down. The suction piece 145, which is formed with a plurality of suction holes (not depicted) in one surface thereof, is connected to a suction means (not depicted). In the first transfer means 141, with a suction force generated at the suction piece 145 by the suction means, the ingot can be suction held by the suction piece 145. In addition, in the first transfer means 141, with the articulated arm 144 driven by the drive source, the ingot suction held by the suction piece 145 is transferred between the carrying tray 9 stopped by the carrying tray stopper 129 and the ingot grinding unit 4.

The cassette stocker 11 will be described referring to FIG. 1. The cassette stocker 11 in the present embodiment has a total of sixteen cassette accommodating sections 146 arranged in four rows in the X-axis direction and in four layers in the Z-axis direction. In each of the cassette accommodating sections 146, a cassette 147 in which the wafers peeled off from the ingot at the wafer peeling unit 8 are accommodated is accommodated. The cassette 147 is configured to be able to accommodate a plurality of (for example, twenty-five) wafers at intervals in the vertical direction. In addition, in the cassette stocker 11, each cassette accommodating section 146 is penetrating in the Y-axis direction, such that the cassette 147 can be accommodated into the cassette accommodating section 146 from the viewer's side in the Y-axis direction in FIG. 1, and the wafers can be accommodated into the cassette 147 in the cassette accommodating section 146 from the depth side in the Y-axis direction in FIG. 1.

As depicted in FIG. 1, the wafer producing apparatus 2 preferably further includes an ingot stocker 148 adapted to accommodates the ingots. The ingot stocker 148 in the present embodiment includes a total of four ingot accommodating sections 149 arranged in two rows in the Y-axis direction and in two layers in the Z-axis direction. In each of the ingot accommodating sections 149, the ingot is accommodated in the state of being supported by the carrying tray 9. Besides, in the ingot stocker 148, each ingot accommodating section 149 is penetrating in the X-axis direction, such that the carrying tray 9 with the ingot supported thereon can be accommodated into the ingot accommodating section 149 from the viewer's side in the X-axis direction in FIG. 1, and the carrying tray 9 in the ingot accommodating section 149 can be carried out from the depth side in the X-axis direction in FIG. 1.

The accommodating means 12 will be described referring to FIGS. 1 and 9. As depicted in FIG. 1, the accommodating means 12 is disposed adjacently to the cassette stocker 11 in the Y-axis direction. Referring to FIG. 9 for description, the accommodating means 12 includes: a support wall 150; an X-axis direction movable member 151 supported on the support wall 150 in such a manner as to be movable in the X-axis direction; X-axis direction moving means 152 for moving the X-axis direction movable member 151 in the X-axis direction; a liftable block 153 supported on the X-axis direction movable member 151 in such a manner as to be liftable up and down; lift means 154 for lifting the liftable block 153 up and down; an articulated arm 155 supported on the liftable lock 153; a holding piece 156 mounted to a tip of the articulated arm 155 in such a manner that it can be inverted upside down; and a drive source (not depicted) adapted to drive the articulated arm 155. The X-axis direction moving means 152, which is supported on the support wall 150, includes a ball screw 157 of which a nut section 157a is fixed to the X-axis direction movable member 151 and which extends in the X-axis direction, and a motor 158 connected to one end portion of the ball screw 157, and moves the X-axis direction movable member 151 in the X-axis direction along guide rails 150a of the support wall 150. The lift means 154, which is supported by the X-axis direction movable member 151, includes a ball screw 159 connected to the liftable block 153 and extending in the Z-axis direction, and a motor 160 connected to one end portion of the ball screw 159, and lifts the liftable block 153 up and down along guide rails 151a of the X-axis direction movable member 151. The drive source, which is composed of an air drive source or an electric drive source, drives the articulate arm 155 to position the holding piece 156 at arbitrary positions in the X-axis direction, the Y-axis direction and the Z-axis direction. The holding piece 156, which is formed with a plurality of suction holes (not depicted) in one surface thereof, is connected to suction means (not depicted).

In the accommodating means 12, when the holding piece 156 with the suction holes faced up is inserted into the cavity 116 of the carrying tray 9 accommodated in the ingot stocker 148 and supporting the ingot, and is slightly moved upward to make close contact with the lower surface of the upper wall 113 of the carrying tray 9, and a suction force is generated at the holding piece 156 by the suction means, the carrying tray 9 can thereby be suction held by the holding means 156. In addition, by driving the articulated arm 155 and moving the liftable block 153 by the X-axis direction moving means 152 and the lift means 154, the carrying tray 9 suction held by the holding piece 156 can be carried from the ingot stocker 148 to the belt conveyor unit 10. Besides, in the accommodating means 12, by inverting the holding piece 156 to face the suction holes downward and generating a suction force at the holding piece 156 by the suction means, the wafer in the carrying tray 9 mounted on the second carrying means 124 can be suction held by the holding piece 156, and the wafer held by the holding piece 156 can be accommodated into the cassette 147 which is accommodated in the cassette stocker 11.

Figure 13A:
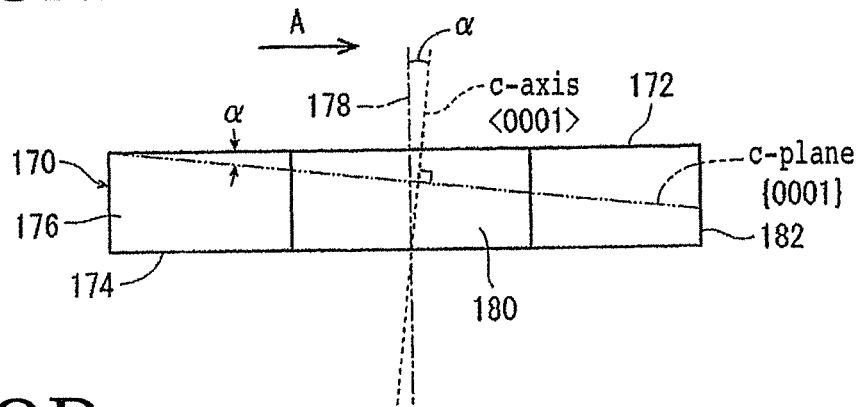
FIG. 13A is a front view of an SiC ingot.
Figure 13B:
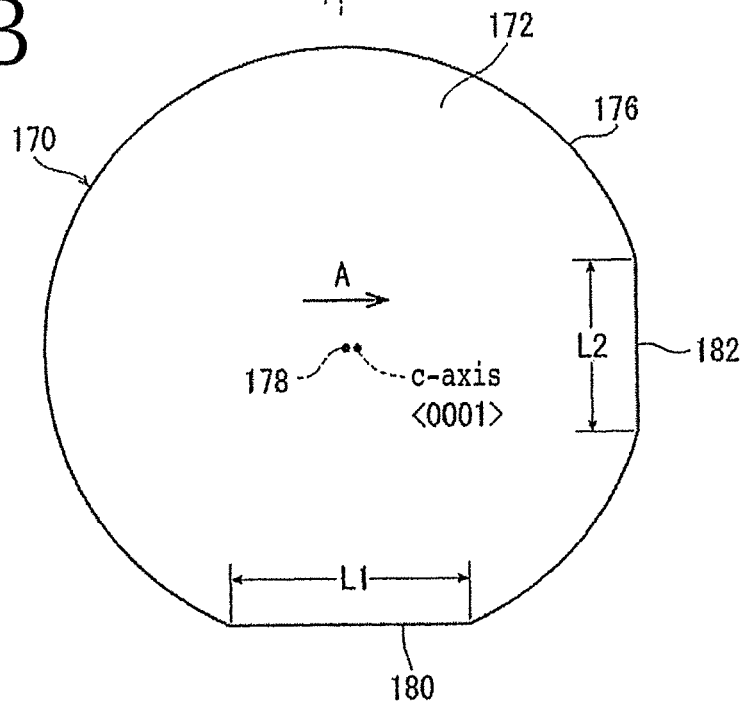
FIG. 13B is a plan view of the SiC ingot.
Figure 13C:
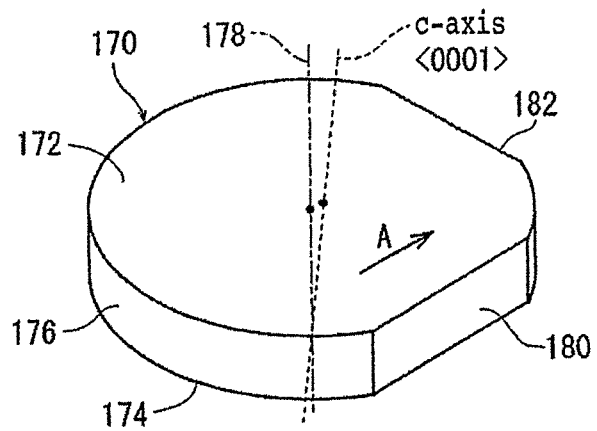
FIG. 13C is a perspective view of the SiC ingot.

FIGS. 13A to 13C depict an ingot 170 which can be processed by the wafer producing apparatus 2. This ingot 170 is formed in a cylindrical overall shape from hexagonal single crystal SiC, and has a circular first surface 172, a circular second surface 174 on the side opposite to the first surface 172, a peripheral surface 176 located between the first surface 172 and the second surface 174, a c-axis (<0001> direction) reaching the second surface 174 from the first surface 172, and a c-plane ({0001} plane) orthogonal to the c-axis. In the ingot 170, the c-axis is inclined relative to a perpendicular 178 to the first surface 172, and an off angle α (for example, α=1, 3, or 6 degrees) is formed by the c-plane and the first surface 172. The direction in which the off angle α is formed is indicated by arrow A in FIGS. 13A to 13C. In addition, the peripheral surface 176 of the ingot 170 is formed with a first orientation flat 180 and a second orientation flat 182 which are rectangular in shape and indicate crystal orientation. The first orientation flat 180 is parallel to the direction A in which the off angle α is formed, whereas the second orientation flat 182 is orthogonal to the direction A in which the off angle α is formed. As depicted in FIG. 13B, as viewed from above, the length L2 of the second orientation flat 182 is shorter than the length L1 of the first orientation flat 180 (L2<L1). Note that the ingot which can be processed by the wafer producing apparatus 2 is not limited to the above-described ingot 170; the ingot may be, for example, a hexagonal single crystal SiC ingot in which the c-axis is not inclined relative to the perpendicular to the first surface and the off angle between the c-plane and the first surface is 0 degrees (namely, the perpendicular to the first surface and the c-axis are coincident with each other), or may be a hexagonal single crystal ingot formed from a material other than the hexagonal single crystal SiC, such as GaN (gallium nitride).

At the time of producing a wafer from the ingot 170 by the aforementioned wafer producing apparatus 2, first, an ingot accommodating step of accommodating the ingots 170 into the ingot stocker 148 is performed. In the ingot accommodating step in the present embodiment, first, four ingots 170 are prepared, and the four ingots 170 are supported by the ingot support sections 117 of four carrying trays 9. Next, the carrying trays 9 supporting the ingots 170 are accommodated into the ingot accommodating sections 149 of the ingot stocker 148.

After the ingot accommodating step is conducted, a first carrying step of carrying the ingot 170 from the ingot stocker 148 to the laser applying unit 6 is carried out by the accommodating means 12 and the belt conveyor unit 10. Normally, the ingot 170 has end faces (the first surface 172 and the second surface 174) planarized to such a degree as not to hamper the incidence of a laser beam in a peel-off layer forming step which will be described later. For this reason, in the present embodiment, an example in which the ingot 170 is carried from the ingot stocker 148 to the laser applying unit 6 in the first carrying step will be described. However, in the case where the end faces of the ingot 170 are not planarized to such a degree as not to hamper the incidence of the laser beam in the peel-off layer forming step, the ingot 170 may be carried from the ingot stocker 148 to the ingot grinding unit 4 in the first carrying step. In the first carrying step, first, the position of the liftable block 153 is controlled by the X-axis direction moving means 152 and the lift means 154 of the accommodating means 12 to such a position that the carrying tray 9 accommodated in the ingot stocker 148 and supporting the ingot 170 can be carried out by the holding piece 156 of the accommodating means 12.

Next, the articulated arm 155 of the accommodating means 12 is driven, the holding piece 156 with the suction holes faced up is inserted into the cavity 116 of the carrying tray 9, and the holding piece 156 is slightly moved upward inside the cavity 116, to bring the holding piece 156 into close contact with the lower surface of the upper wall 113 of the carrying tray 9. Subsequently, a suction force is generated at the holding piece 156, whereby the carrying tray 9 is suction held by the suction piece 156. Next, the articulated arm 155 is driven, and the liftable block 153 is moved by the X-axis direction moving means 152 and the lift means 154, whereby the lower surface of the carrying tray 9 suction held by the holding piece 156 is brought into contact with the upper surface of the endless belt 127 of the forward-path belt conveyors 121. Subsequently, the suction force of the holding piece 156 is released, the articulated arm 155 is driven, the holding piece 156 is slightly lowered inside the cavity 116 of the carrying tray 9, and the holding piece 156 is drawn out of the cavity 116, whereby the carrying tray 9 is placed on the forward-path belt conveyor 121. Note that the carrying tray 9 may be placed on the forward-path belt conveyor 121 through the second carrying means 124.

After the carrying tray 9 is placed on the forward-path belt conveyor 121, the carrying tray 9 is carried by the forward-path belt conveyors 121 to a position for facing the laser applying unit 6. In this case, the liftable plate 131 of the carrying tray stopper 129 disposed at the position for facing the ingot grinding unit 4 is positioned at the passage position, whereas the liftable plate 131 of the carrying tray stopper 129 disposed at the position for facing the laser applying unit 6 is positioned at the stop position. By this, the carrying tray 9 being carried in the Y1 direction by the forward-path belt conveyors 121 can be made to pass above the upper side of the carrying tray stopper 129 disposed at the position for facing the ingot grinding unit 4, and can be stopped by the carrying tray stopper 129 at the position for facing the laser applying unit 6. Next, the lower surface of the carrying tray 9 thus stopped is spaced away from the upper surface of the endless belt 127, and the liftable plate 131 of the carrying tray stopper 129 is lifted up to the spacing position.

Figure 14:
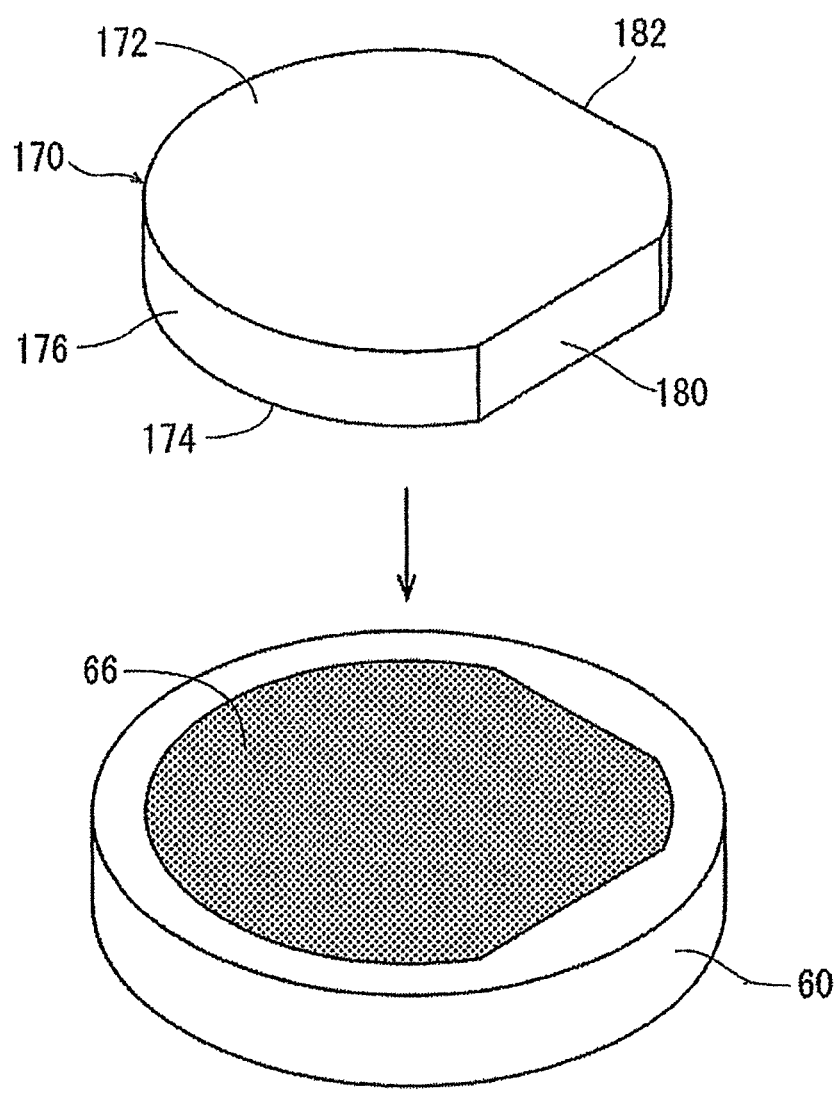
FIG. 14 is a perspective view depicting a state in which the SiC ingot is being carried to a second holding table of a laser applying unit.

Subsequently, the articulated arm 144 of the second transfer means 142 is driven, and the suction piece 145 is brought into close contact with an upper surface (in the present embodiment, the first surface 172) of the ingot 170. Next, the suction means connected to the suction piece 145 is operated to generate a suction force at the suction piece 145, whereby the ingot 170 is suction held by the suction piece 145. Subsequently, the articulated arm 144 is driven to move the suction piece 145, and, as depicted in FIG. 14, a lower surface (in the present embodiment, the second surface 174) of the ingot 170 suction held by the suction piece 145 is brought into contact with an upper surface of the second holding table 60. In this case, the second holding table 60 is positioned at the ingot attachment/detachment position (the position depicted in FIG. 4) for attaching or detaching the ingot. Then, the suction means connected to the suction piece 145 is stopped, to release the suction force at the suction piece 145, whereby the ingot 170 is placed on the upper surface of the second holding table 60. In this way, the ingot 170 is carried from the ingot stocker 148 to the laser applying unit 6.

After the first carrying step is conducted, a peel-off layer forming step is carried out, by the laser applying unit 6, in which the ingot 170 is held by the second holding table 60, and a laser beam of such a wavelength as to be transmitted through the ingot 170 is applied to the ingot 170, with a focal point of the laser beam positioned at a depth corresponding to the thickness of the wafer to be produced from the upper surface of the ingot 170 held by the second holding table 60, to form a peel-off layer. In the peel-off layer forming step, first, a suction force is generated at the upper surface of the second holding table 60, to suction hold the ingot 170 by the second holding table 60. Next, the second holding table 60 is moved in the X-axis direction by the X-axis direction moving means, and the Y-axis direction movable member is moved in the Y-axis direction by the Y-axis direction moving means, to position the ingot 170 on the lower side of the alignment means 76. Subsequently, the ingot 170 is imaged by the alignment means 76 from above the ingot 170. Next, the second holding table 60 is rotated and moved by the second holding table motor and the X-axis direction moving means, based on the image of the ingot 170 picked up by the alignment means 76, and the Y-axis direction movable member is moved by the Y-axis direction moving means, to adjust the orientation of the ingot 170 to a predetermined direction and to adjust the positions of the ingot 170 and the focusing apparatus 74 on an XY plane.

Figure 15A:
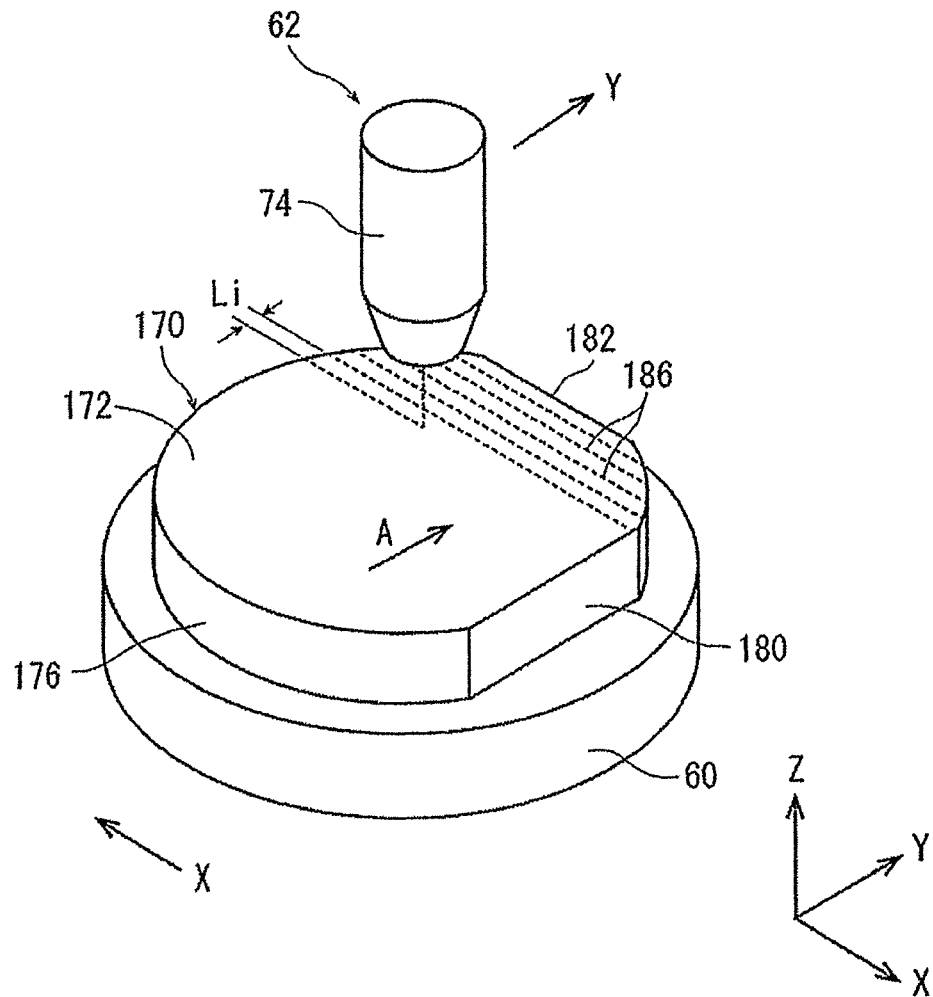
FIG. 15A is a perspective view depicting a state in which a peel-off layer forming step is being applied to the SiC ingot.
Figure 15B:
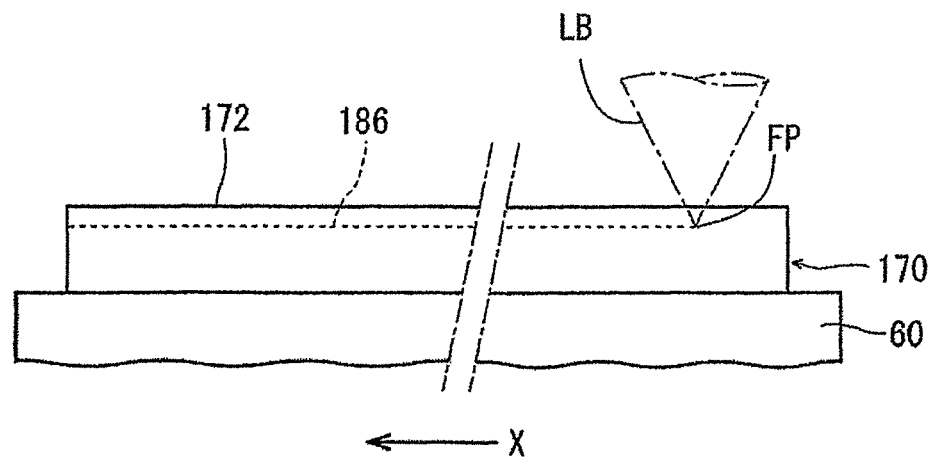
FIG. 15B is a front view depicting the state in which the peel-off layer forming step is being applied to the SiC ingot.
Figure 16A:
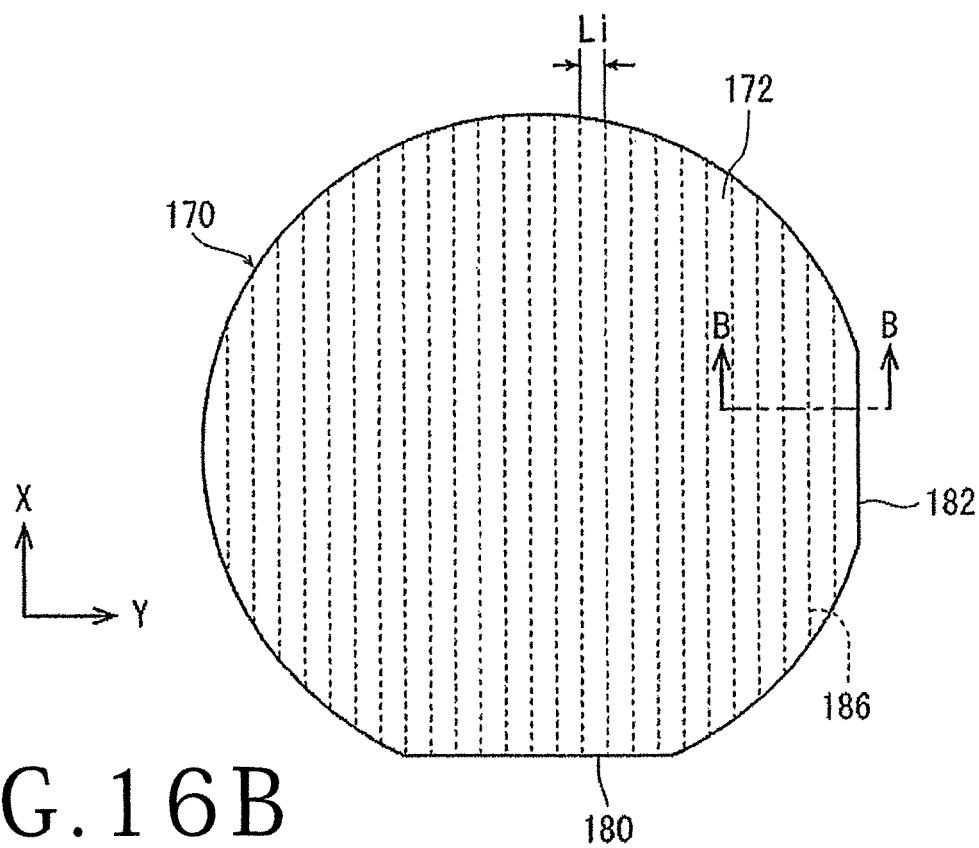
FIG. 16A is a plan view of the SiC ingot formed with a peel-off layer.
Figure 16B:
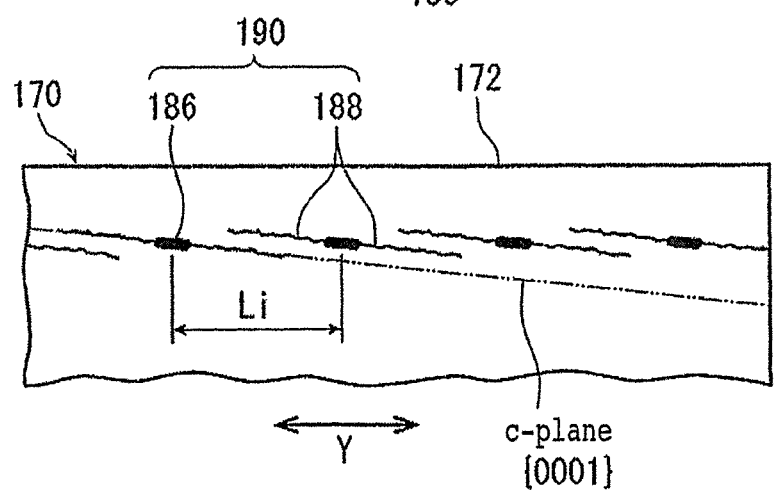
FIG. 16B is a sectional view taken alone line B-B of FIG. 16A.

At the time of adjusting the orientation of the ingot 170 to the predetermined direction, as depicted in FIG. 15A, the second orientation flat 182 is matched to the X-axis direction, whereby the direction orthogonal to the direction A in which the off angle α is formed is matched to the X-axis direction, and the direction A in which the off angle α is formed is matched to the Y-axis direction. Next, the focusing apparatus 74 is lifted up or down by the focal point position control means, to position the focal point FP at a depth corresponding to the thickness of the wafer to be produced from the first surface 172 of the ingot 170, as depicted in FIG. 15B. Subsequently, the peel-off layer forming step is performed in which a pulsed laser beam LB of such a wavelength as to be transmitted through the ingot 170 is applied through the focusing apparatus 74 to the ingot 170, while moving the second holding table 60 by the X-axis direction moving means in the X-axis direction matched to the direction orthogonal to the direction A in which the off angle α is formed. When the peel-off layer forming step is conducted, as depicted in FIGS. 16A and 16B, a modified layer 186 in which SiC is separated into Si (silicon) and C (carbon) by the application of the pulsed laser beam LB, the pulsed laser beam LB applied next is absorbed in the previously formed C and SiC is separated into Si and C in a chain reaction manner is continuously formed in the direction orthogonal to the direction A in which the off angle α is formed, and a crack 188 extending isotropically from the modified layer 186 along the c-plane is produced.

Referring to FIGS. 15A to 16B for continuing the description, following the peel-off layer forming step, the Y-axis direction movable member is moved by the Y-axis direction moving means, whereby indexing feeding of the focal point FP, in the Y-axis direction matched to the direction A in which the off angle α is formed, relative to the ingot 170 by a predetermined indexing amount Li within such a range as not to exceed the width of the crack 188 is performed. Then, the peel-off layer forming step and the indexing feeding are alternately repeated, to form a plurality of the modified layers 186 extending continuously in the direction orthogonal to the direction A in which the off angle α is formed, at an interval of the predetermined indexing amount Li in the direction A in which the off angle α is formed, and to sequentially produce the cracks 188 extending isotropically from the modified layers 186 along the c-plane, such that the crack 188 and the crack 188 adjacent to each other in the direction A in which the off angle α is formed overlap each other as viewed in the vertical direction. By this, a peel-off layer 190 which is composed of pluralities of modified layers 186 and cracks 188 and at which the strength is lowered for peeling off the wafer from the ingot 170 can be formed at the depth corresponding to the thickness of the wafer to be produced from the upper surface of the ingot 170. After the peel-off layer 190 is formed, the second holding table 60 is positioned at the ingot attachment/detachment position, and the suction force of the second holding table 60 is released. Note that the peel-off layer forming step may be carried out, for example, in the following processing conditions.

Wavelength of pulsed laser beam: 1,064 nm
Repetition frequency: 80 kHz
Average output: 3.2 W
Pulse width: 4 ns
Diameter of focal point: 3 μm
Numerical aperture (NA) of focusing lens: 0.43
Z-axis directional position of focal point: 300 μm from upper surface of ingot
Feeding speed of second holding table: 120 to 260 mm/s
Indexing amount: 250 to 400 μm After the peel-off layer forming step is conducted, a second carrying step of carrying the ingot 170 formed with the peel-off layer 190 from the laser applying unit 6 to the wafer peeling unit 8 is carried out by the belt conveyor unit 10. In the second carrying step, first, the articulated arm 144 of the second transfer means 142 is driven to bring the suction piece 145 into close contact with the first surface 172 of the ingot 170 on the second holding table 60, and the ingot 170 is suction held by the suction piece 145. Next, the articulated arm 144 is driven to move the suction piece 145, to bring the second surface 174 of the ingot 170 suction held by the suction piece 145 into contact with the ingot support section 117 of the carrying tray 9. Subsequently, the suction force of the suction piece 145 is released, whereby the ingot 170 is supported by the ingot support section 117 of the carrying tray 9. Next, the liftable plate 131 of the carrying tray stopper 129 is lifted down from the spacing position to the passage position, whereby the carrying tray 9 is placed on the endless belt 127 of the forward-path belt conveyors 121.

After the carrying tray 9 is placed on the forward-path belt conveyor 121, the carrying tray 9 is carried by the forward-path belt conveyors 121 to a position (in the present embodiment, the finish point of the forward-path belt conveyors 121) for facing the wafer peeling unit 8. In this case, the liftable plate 135 is positioned at such a position that the upper surface of the Y-axis direction movable plate 137 of the first carrying means 123 is below the upper surface of the endless belt 127 of the forward-path belt conveyors 121 and that the stopper piece 138 makes contact with the carrying tray 9 being carried by the forward-path belt conveyors 121, and the Y-axis direction movable plate 137 is positioned at the advanced position. By this, the stopper piece 138 can be put into contact with the carrying tray 9 being carried in the Y1 direction by the forward-path belt conveyors 121, and the carrying tray 9 can be stopped at the position for facing the wafer peeling unit 8. Next, the liftable plate 135 of the first carrying means 123 is lifted up, the stopped carrying tray 9 is mounted on the upper surface of the Y-axis direction movable plate 137, and the lower surface of the carrying tray 9 is spaced away from the upper surface of the endless belt 127. Subsequently, the articulated arm 144 of the third transfer means 143 is driven, to bring the suction piece 145 into close contact with the first surface 172 of the ingot 170, and the ingot 170 is suction held by the suction piece 145. Next, the articulated arm 144 is driven to move the suction piece 145, to bring the second surface 174 of the ingot 170 suction held by the suction piece 145 into contact with the upper surface of the third holding table 80 of the wafer peeling unit 8. In this instance, the third holding table 80 is positioned at the ingot attachment/detachment position (the position depicted in FIG. 6) for attaching or detaching the ingot. Then, the suction force of the suction piece 145 is released, whereby the ingot 170 is mounted on the upper surface of the third holding table 80. In this way, the ingot 170 is carried from the laser applying unit 6 to the wafer peeling unit 8.

Figure 17A:
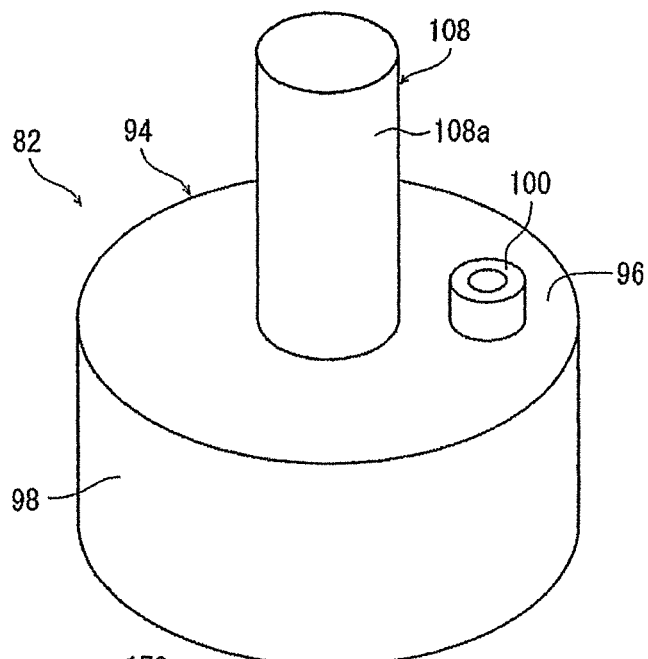
FIG. 17A is a perspective view depicting a state in which a liquid tank is positioned on the upper side of a third holding table of a wafer peeling unit.
Figure 17B:
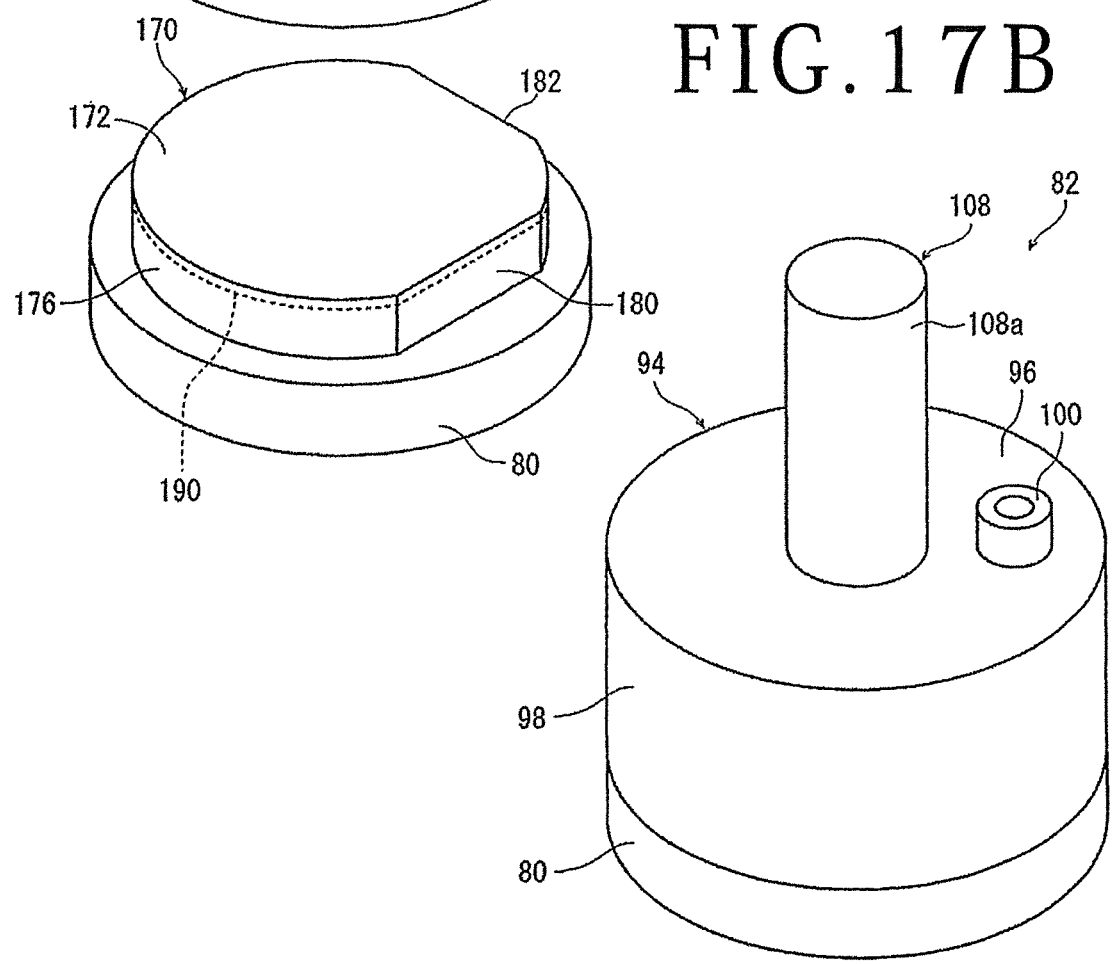
FIG. 17B is a perspective view depicting a state in which a lower surface of the liquid tank makes contact with an upper surface of a holding table.

After the second carrying step is performed, a wafer peeling step is carried out, by the wafer peeling unit 8, in which the ingot 170 formed with the peel-off layer 190 is held by the third holding table 80, the upper surface of the ingot 170 held by the third holding table 80 is held and the wafer is peeled off from the peel-off layer 190. In the wafer peeling step, first, the ingot 170 is suction held by the third holding table 80. Next, as depicted in FIG. 17A, the third holding table 80 is positioned at a wafer peeling position under the liquid tank 94. Subsequently, as depicted in FIG. 17B, the arm 92 is lowered by the arm moving means, to bring the lower end of the skirt wall 98 of the liquid tank 94 into close contact with the upper surface of the third holding table 80. Next, as depicted in FIG. 7, the piston rod 108b of the air cylinder 108 is moved, to bring the lower surface of the suction piece 112 into close contact with the first surface 172 of the ingot 170. Subsequently, a suction force is generated at the lower surface of the suction piece 112, and the ingot 170 is suction held by the suction piece 112 from the first surface 172 side. Next, the liquid supply means connected to the liquid supply section 100 is operated, and the liquid 106 (for example, water) is supplied from the liquid supply section 100 into the liquid accommodating space 104 until the ultrasonic vibration generating member 110 is immersed in the liquid 106. Subsequently, the ultrasonic vibration generating member 110 is operated, to apply an ultrasonic vibration to the ingot 170, whereby the peel-off layer 190 is stimulated to cause the cracks 188 to extend, thereby further lowering the strength of the peel-off layer 190.

Figure 18:
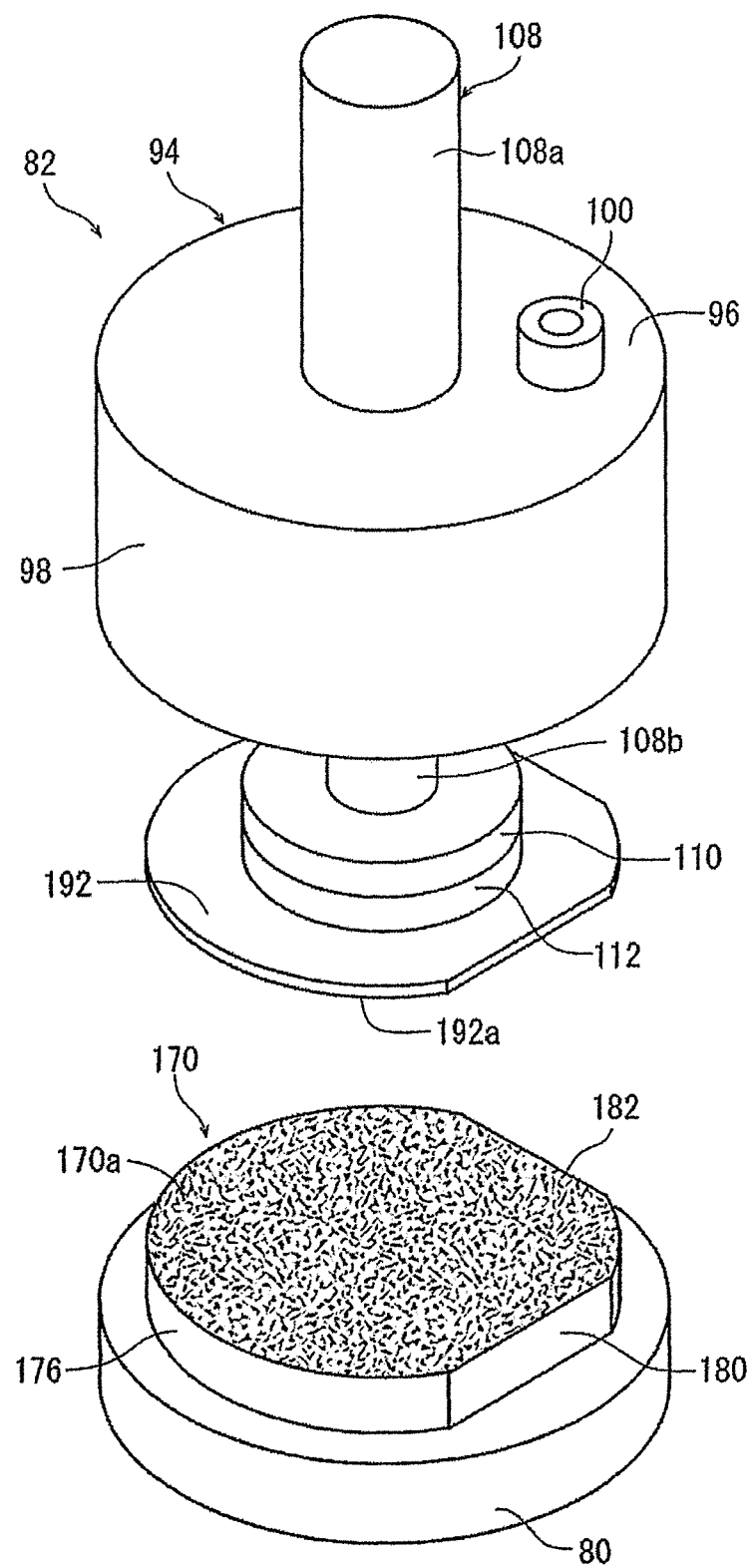
FIG. 18 is a perspective view depicting a state in which a wafer is peeled off from the SiC ingot by the wafer peeling unit.

Next, in a state in which the ingot 170 is suction held by the suction piece 112, the arm 92 is moved upward by the arm moving means, whereby the wafer 192 to be produced can be peeled off from the ingot 170 as depicted in FIG. 18, with the peel-off layer 190 as a start point of peeling. In addition, when the arm 92 is moved upward by the arm moving means, the liquid 106 is discharged from the liquid accommodating space 104, and the liquid 106 is discharged to the outside of the wafer peeling unit 8 through a discharge port (not depicted) formed in the base 84. After the wafer 192 is peeled off from the ingot 170, the third holding table 80 is positioned at the ingot attachment/detachment position, and the suction force of the third holding table 80 is released. Note that at the time of applying the ultrasonic vibration to the ingot 170, a gap (for example, 2 to 3 mm) may be provided between the upper surface of the ingot 170 and the lower surface of the suction piece 112. Besides, at the time of peeling off the wafer 192 from the ingot 170 with the peel-off layer 190 as a start point of peeling, the wafer 192 may be peeled off from the ingot 170 by suction holding the upper surface of the ingot 170 by the suction piece 145 of the third transfer means 143 and then moving the suction piece 145 upward.

After the wafer peeling step is conducted, a third carrying step of carrying the wafer 192 peeled off from the ingot 170 from the wafer peeling unit 8 to the cassette 147 in the cassette stocker 11 and accommodating the wafer 192 into the cassette 147 is carried out by the belt conveyor unit 10 and the accommodating means 12. In the third carrying step, first, the articulated arm 144 of the third transfer means 143 is driven to bring the suction piece 145 of the third transfer means 143 into close contact with the lower surface (peel-off surface) of the wafer 192 suction held by the suction piece 112 of the wafer peeling means 82, and the wafer 192 is suction held by the suction piece 145. Next, the suction force of the suction piece 112 of the wafer peeling means 82 is released, and the wafer 192 is transferred from the suction piece 112 of the wafer peeling means 82 to the suction piece 145 of the third transfer means 143. Subsequently, the articulated arm 144 is driven to move the suction piece 145, to bring the wafer 192 suction held by the suction piece 145 into contact with the wafer support section 118 of the carrying tray 9. Next, the suction force of the suction piece 145 is released, whereby the wafer 192 is supported by the wafer support section 118 of the carrying tray 9.

In addition, in the third carrying step, the wafer 192 is carried, and, in order to carry the ingot 170, from which the wafer 192 has been peeled off, from the wafer peeling unit 8 to the ingot grinding unit 4, the articulated arm 144 is driven, to bring the suction piece 145 into close contact with the peel-off surface 170a of the ingot 170 on the third holding table 80. Next, the articulated arm 144 is driven to move the suction piece 145, and the ingot 170 suction held by the suction piece 145 is carried to, and supported by, the ingot support section 117 of the carrying tray 9. Subsequently, the Y-axis direction movable plate 137 of the first carrying means 123 on which the carrying tray 9 is mounted is positioned at the retreated position. Next, the liftable plate 135 is lifted down, to position the upper surface of the Y-axis direction movable plate 137 slightly above the upper surface of the endless belt 127 of the return-path belt conveyors 122. Subsequently, the Y-axis direction movable plate 137 is positioned at the advanced position, and the liftable plate 135 is lifted down, whereby the carrying tray 9 is placed on the endless belt 127 of the return-path belt conveyors 122.

After the carrying tray 9 is mounted on the return-path belt conveyor 122, the carrying tray 9 is carried by the return-path belt conveyors 122 to the finish point of the return-path belt conveyors 122. In this case, the liftable plate 135 is positioned at such a height that the upper surface of the Y-axis direction movable plate 137 of the second carrying means 124 is below the upper surface of the endless belt 127 of the return-path belt conveyors 122 and that the stopper piece 138 makes contact with the carrying tray 9 being carried by the return-path belt conveyors 122. By this, the stopper piece 138 can be put into contact with the carrying tray 9 being carried in the Y2 direction by the return-path belt conveyors 122, and the carrying tray 9 can be stopped at the finish point of the return-path belt conveyors 122. Next, the liftable plate 135 is slightly lifted up, the stopped carrying tray 9 is mounted on the upper surface of the Y-axis direction movable plate 137, and the lower surface of the carrying tray 9 is spaced away from the upper surface of the endless belt 127. Subsequently, the Y-axis direction movable plate 137 is positioned at the retreated position. Next, the liftable plate 135 is lifted up, to position the upper surface of the Y-axis direction movable plate 137 slightly above the upper surface of the endless belt 127 of the forward-path belt conveyors 121.

Subsequently, the liftable block 153 is moved by the X-axis direction moving means 152 and the lift means 154 of the accommodating means 12, and the articulated arm 155 is driven, to thereby bring the holding piece 156 into close contact with the upper surface of the wafer 192 supported by the carrying tray 9 on the Y-axis direction movable plate 137, followed by suction holding the wafer 192 by the holding piece 156. Then, the holding piece 156 is moved by the X-axis direction moving means 152, the lift means 154 and the articulated arm 155, whereby the wafer 192 suction held by the holding piece 156 is carried out from the carrying tray 9 and is moved into the cassette 147 in the cassette stocker 11. Then, the suction force of the holding piece 156 is released. In this way, the wafer 192 peeled off from the ingot 170 is carried from the wafer peeling unit 8 to the cassette 147 in the cassette stocker 11, and is accommodated into the cassette 147.

In addition, after the wafer 192 is carried out from the carrying tray 9, the Y-axis direction movable plate 137 of the second carrying means 124 is positioned at the advanced position, and the liftable plate 135 is lifted down, whereby the carrying tray 9 is placed on the endless belt 127 of the forward-path belt conveyors 121. In this instance, the liftable plate 131 of the carrying tray stopper 129 disposed at the position for facing the ingot grinding unit 4 is positioned at the stop position. By this, the carrying tray 9 being carried in the Y1 direction by the forward-path belt conveyors 121 can be stopped by the carrying tray stopper 129 at the position for facing the ingot grinding unit 4. Next, in order to space the lower surface of the stopped carrying tray 9 away from the upper surface of the endless belt 127, the liftable plate 131 of the carrying tray stopper 129 is lifted up to the spacing position. Subsequently, the articulated arm 144 of the first transfer means 141 is driven, to bring the suction piece 145 into close contact with the peel-off surface 170a of the ingot 170, and the ingot 170 is suction held by the suction piece 145. Next, the articulated arm 144 is driven to move the suction piece 145, whereby the second surface 174 of the ingot 170 is brought into contact with the upper surface of the first holding table 14 of the ingot grinding unit 4 that is positioned at the ingot attachment/detachment position. Then, the suction force of the suction piece 145 is released, whereby the ingot 170 is placed on the upper surface of the first holding table 14. In this way, the ingot 170 from which the wafer 192 has been peeled off is carried from the wafer peeling unit 8 to the ingot grinding unit 4.

After the third carrying step is conducted, an ingot grinding step is carried out, by the ingot grinding unit 4, in which the ingot 170 from which the wafer 192 has been peeled off is held by the first holding table 14, and the peel-off surface 170a of the ingot 170 held by the first holding table 14 is ground and planarized. Referring to FIG. 3 for description, in the ingot grinding step, first, a suction force is generated at the upper surface of the first holding table 14, to suction hold the ingot 170 by the first holding surface 14. Next, the first holding table 14 holding the ingot 170 is positioned at a grinding position. Subsequently, the first holding table 14 holding the ingot 170 is rotated counterclockwise, as viewed from above, at a predetermined rotating speed (for example, 300 rpm). In addition, the spindle 36 is rotated counterclockwise, as viewed from above, at a predetermined rotating speed (for example, 6,000 rpm). Next, the spindle housing 30 is lowered, to bring the grindstones 44 into contact with the peel-off surface 170a of the ingot 170. After the grindstones 44 are put into contact with the peel-off surface 170a, the spindle housing 30 is lowered at a predetermined grinding feeding speed (for example, 1.0 µm/s). By this, the peel-off surface 170a of the ingot 170 from which the wafer 192 has been peeled off can be ground, to planarize the peel-off surface 170a of the ingot 170 to such an extent as not to hamper the incidence of the pulsed laser beam LB in the peel-off layer forming step. After the peel-off surface 170a of the ingot 170 is planarized, the first holding table 14 holding the ingot 170 is positioned at the ingot attachment/detachment position, and the suction force of the first holding table 14 is released.

After the ingot grinding step is conducted, a fourth carrying step of carrying the ingot 170 having the peel-off surface 170a planarized from the ingot grinding unit 4 to the laser applying unit 6 is carried out by the belt conveyor unit 10. In the fourth carrying step, first, the articulated arm 144 of the first transfer means 141 is driven, to bring the suction piece 145 into close contact with the peel-off surface 170a of the ingot 170 on the first holding table 14, and the ingot 170 is suction held by the suction piece 145. Next, the articulated arm 144 is driven to move the suction piece 145, and the second surface 174 of the ingot 170 suction held by the suction piece 145 is put into contact with the ingot support section 117 of the carrying tray 9. Subsequently, the suction force of the suction piece 145 is released, whereby the ingot 170 is supported by the ingot support section 117 of the carrying tray 9. Next, the liftable plate 131 of the carrying tray stopper 129 is lifted down from the spacing position to the passage position, whereby the carrying tray 9 is placed on the endless belt 127 of the forward-path belt conveyors 121.

After the carrying tray 9 is placed on the forward-path belt conveyor 121, the carrying tray 9 is carried by the forward-path belt conveyors 121 to the position for facing the laser applying unit 6. In this case, the liftable plate 131 of the carrying tray stopper 129 disposed at the position for facing the laser applying unit 6 is positioned at the stop position, and the carrying tray 9 being carried in the Y1 direction by the forward-path belt conveyor 121 is stopped by the carrying tray stopper 129 at the position for facing the laser applying unit 6. Next, in order to space the lower surface of the stopped carrying tray 9 away from the upper surface of the endless belt 127, the liftable plate 131 of the carrying tray stopper 129 is lifted up to the spacing position. Subsequently, the articulated arm 144 of the second transfer means 142 is driven, to bring the suction piece 145 into close contact with the peel-off surface 170a of the ingot 170, and the ingot 170 is suction held by the suction piece 145. Next, the articulated arm 144 is driven to move the suction piece 145, and the second surface 174 of the ingot 170 suction held by the suction piece 145 is brought into contact with the upper surface of the second holding table 60 of the laser applying unit 6. Then, the suction force of the suction piece 145 is released, whereby the ingot 170 is placed on the upper surface of the second holding table 60. In this way, the ingot 170 having the peel-off surface 170a planarized is carried from the ingot grinding unit 4 to the laser applying unit 6.

After the fourth carrying step is performed, the aforementioned peel-off layer forming step is carried out by the laser applying unit 6. Then, the peel-off layer forming step, the wafer peeling step, the ingot grinding step, and the second to fourth carrying steps are conducted repeatedly, whereby a number of wafers 192 which can be produced from the ingot 170 are produced, and the wafers 192 are accommodated in the cassettes 147 in the cassette stocker 11.

The steps performed for the ingot 170 in the wafer producing apparatus 2 have been described above paying attention to a single ingot 170. In the wafer producing apparatus 2, after the first carrying step of carrying the ingot 170 from the ingot stocker 148 to the laser applying unit 6 is conducted, the first carrying step is repeated, at appropriate intervals, and the peel-off layer forming step, the wafer peeling step, the ingot grinding step, and the second to fourth carrying steps are performed for a plurality of (in the present embodiment, four) ingots 170 concurrently and repeatedly, whereby a number of wafers 192 which can be produced from a plurality of ingots 170 can be produced. In addition, in the case where the number of the wafers 192 to be produced from one ingot 170 is 100 sheets, for example, the wafers 192 are accommodated in four cassettes 147 each capable of accommodating 25 sheets of wafers 192. In this case, IDs for distinguishing the carrying trays 9 from one another may be given to the carrying trays 9, and the wafer producing apparatus 2 may be provided with means reading the IDs of the carrying wafers 9, whereby the produced wafers 192 can be accommodated into the cassette 147 in the state of being classified on the basis of each ingot 170.

As has been described above, the wafer producing apparatus 2 in the present embodiment includes, at least: the ingot grinding unit 4 which is composed at least of the first holding table 14 adapted to hold the ingot 170, and the grinding means 16 for grinding and planarizing the upper surface of the ingot 170 held by the first holding table 14; the laser applying unit 6 which is composed at least of the second holding table 60 adapted to hold the ingot 170, and the laser applying means 62 for applying the laser beam LB of such a wavelength as to be transmitted through the ingot 170 to the ingot 170, with a focal point FP of the laser beam LB positioned at a depth corresponding to the thickness of the wafer to be produced from the upper surface of the ingot 170 held by the second holding table 60, to form the peel-off layer 190; the wafer peeling unit 8 composed at least of the third holding table 80 adapted to hold the ingot 170, and the wafer peeling means 82 for holding the upper surface of the ingot 170 held by the third holding table 80 and peeling off the wafer 192 from the peel-off layer 190; the carrying tray 9 having the ingot support section 117 adapted to support the ingot 170 and the wafer support section 118 adapted to support the wafer 192; the belt conveyor unit 10 adapted to carry the ingot 170 supported by the carrying tray 9 between the ingot grinding unit 4 and the laser applying unit 6 and the wafer peeling unit 8; the cassette stocker 11 in which a plurality of the cassettes 147 each accommodating the peeled wafer 192 are accommodated; and the accommodating means 12 by which the wafer 192 supported by the wafer support section 118 of the carrying tray 9 is accommodated into the cassette 147 accommodated in the cassette stocker 11. Therefore, a series of operations of producing the wafers 192 from the ingot 170 can be carried out automatically, and production efficiency is enhanced.

In addition, in the wafer producing apparatus 2 in the present embodiment, each of the units is configured independently, and, therefore, the respective numbers of the units can be changed according to the ingot conditions such as material and size, the user's request and the like. For instance, where the wafer producing apparatus 2 has pluralities of the units, the same step can thereby be performed concurrently, and the number of the wafers produced per unit time can be increased. In addition, where the number of a unit performing a step requiring a comparatively longer time in the wafer producing apparatus 2 is greater than the number of a unit performing a step requiring a comparatively shorter time in the wafer producing apparatus 2, stagnation of the progress of the steps can thereby be restrained, and production efficiency can be enhanced.

Further, the carrying tray 9 in the present embodiment has the ingot support section 117 adapted to support the ingot 170 and the wafer support section 118 adapted to support the wafer 192, and, therefore, the ingots 170 and the wafers 192 peeled off from the ingots 170 can be carried.

Note that in the present embodiment, an example has been described in which the ingot 170 is moved relative to the focal point FP in the direction orthogonal to the direction A in which the off angle α is formed in the peel-off layer forming step and in which the focal point FP is moved relative to the ingot 170 in the direction A in which the off angle α is formed in the indexing feeding. However, the moving direction of the ingot 170 relative to the focal point FP may not be the direction orthogonal to the direction A in which the off angle α is formed, and the moving direction of the focal point FP relative to the ingot 170 in the indexing feeding may not be the direction A in which the off angle α is formed.

In addition, optionally, a wafer grinding unit grinding and planarizing the peel-off surface of the wafer 192 peeled off from the ingot 170 may be provided, and the peel-off surface of the wafer 192 may be planarized by the wafer grinding unit before accommodating the wafer 192 into the cassette. Further, a cleaning unit cleaning the ingot 170 ground by the ingot grinding unit 4 and/or the wafer 192 ground by the wafer grinding unit may be provided.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing apparatus for producing a wafer from a hexagonal single crystal ingot, the wafer producing apparatus comprising:

an ingot grinding unit configured to include (i) a first holding table adapted to hold the hexagonal single crystal ingot, and (ii) grinding means grinding and planarizing an upper surface of the ingot held by the first holding table;

a laser applying unit configured to include (i) a second holding table adapted to hold the hexagonal single crystal ingot, and (ii) laser applying means applying a laser beam of such a wavelength as to be transmitted into the hexagonal single crystal ingot held by the second holding table with a focal point of the laser beam positioned at a depth from the upper surface of the hexagonal single crystal ingot corresponding to a thickness of the wafer to be produced to form a peel-off layer;

a wafer peeling unit configured to include (i) a third holding table adapted to hold the hexagonal single crystal ingot, and (ii) wafer peeling means holding the upper surface of the hexagonal single crystal ingot held by the third holding table and peeling off the wafer from the peel-off layer;

a carrying tray including (i) an ingot support section configured to support the hexagonal single crystal ingot, and (ii) a wafer support section adapted to support the peeled wafer;

a belt conveyor unit configured to carry the hexagonal single crystal ingot supported by the carrying tray between the ingot grinding unit and the laser applying unit and the wafer peeling unit;

a cassette stocker in which a cassette adapted to accommodate the peeled wafer is accommodated; and accommodating means transferring the wafer supported by the wafer support section of the carrying tray into the cassette accommodated in the cassette stocker.

2. The wafer producing apparatus according to claim 1, further comprising an ingot stocker adapted to accommodate the hexagonal single crystal ingot.

3. The wafer producing apparatus according to claim 2, wherein the accommodating means carries the hexagonal single crystal ingot accommodated in the ingot stocker to the belt conveyor unit.

4. The wafer producing apparatus according to claim 2, wherein the hexagonal single crystal ingot is accommodated in the ingot stocker in a state of being supported by the carrying tray.

5. The wafer producing apparatus of claim 1,
wherein the carrying tray includes a casing having an upper wall, a lower wall, a pair of side walls connecting the upper wall and the lower wall, and a cavity penetrating between the pair of side walls, and one of the upper wall and the lower wall of the casing is provided with the ingot support section, and other of the lower wall or the upper wall is provided with the wafer support section.

6. The wafer producing apparatus of claim 1, wherein the ingot support section has concentric recesses corresponding to ingots of two or more sizes, and the wafer support section has concentric recesses corresponding to wafers of two or more sizes.

7. A wafer producing apparatus for producing a wafer from a hexagonal single crystal ingot, the wafer producing apparatus comprising:

an ingot grinding unit comprising (i) a first holding table adapted to hold the hexagonal single crystal ingot, and (ii) grinding means for grinding and planarizing an upper surface of the ingot held by the first holding table;

a laser applying unit configured to include (i) a second holding table adapted to hold the ingot, and (ii) a laser applying a laser beam of such a wavelength as to be transmitted into the ingot held by the second holding table with a focal point of the laser beam positioned at a depth from the upper surface of the ingot corresponding to a thickness of the wafer to be produced to form a peel-off layer;

a wafer peeling unit configured to include (i) a third holding table adapted to hold the ingot, and (ii) wafer peeling means holding the upper surface of the ingot held by the third holding table and peeling off the wafer from the peel-off layer;

a carrying tray including (i) an ingot support section configured to support the ingot, and (ii) a wafer support section adapted to support the peeled wafer;

a belt conveyor unit configured to carry the ingot supported by the carrying tray between the ingot grinding unit and the laser applying unit and the wafer peeling unit;

a cassette stocker in which a cassette adapted to accommodate the peeled wafer is accommodated; and accommodating means transferring the wafer supported by the wafer support section of the carrying tray into the cassette accommodated in the cassette stocker.

* * * * *